United States Patent
Crisp et al.

(10) Patent No.: US 8,787,034 B2
(45) Date of Patent: Jul. 22, 2014

(54) CO-SUPPORT SYSTEM AND MICROELECTRONIC ASSEMBLY

(71) Applicant: Invensas Corporation, San Jose, CA (US)

(72) Inventors: Richard Dewitt Crisp, Hornitos, CA (US); Belgacem Haba, Saratoga, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/839,402

(22) Filed: Mar. 15, 2013

(65) Prior Publication Data

US 2014/0055941 A1  Feb. 27, 2014

Related U.S. Application Data

(63) Continuation-in-part of application No. 13/595,486, filed on Aug. 27, 2012, now abandoned.

(51) Int. Cl.
*H05K 1/11* (2006.01)
*H05K 1/14* (2006.01)

(52) U.S. Cl.
USPC ........... 361/803; 361/784; 361/793; 361/794; 361/795

(58) Field of Classification Search
USPC ................. 361/760–795, 803; 257/685–730, 257/777–780
See application file for complete search history.

(56) References Cited

U.S. PATENT DOCUMENTS

| 3,670,208 A | 6/1972 | Hovnanian et al. |
| 4,747,081 A | 5/1988 | Heilveil et al. |

(Continued)

FOREIGN PATENT DOCUMENTS

| EP | 1205977 A2 | 5/2002 |
| JP | 2002-076252 A | 3/2002 |

(Continued)

OTHER PUBLICATIONS

U.S. Appl. No. 13/346,201, filed Jan. 9, 2012.

(Continued)

*Primary Examiner* — Tuan T Dinh
(74) *Attorney, Agent, or Firm* — Lerner, David, Littenberg, Krumholz & Mentlik, LLP

(57) ABSTRACT

A system includes a microelectronic assembly having terminals and a microelectronic element, and a component for connection with the microelectronic assembly. The component includes a support structure bearing conductors configured to carry command and address information, and contacts coupled to the conductors and connected with the terminals of the microelectronic assembly. The contacts have address and command information assignments arranged in a first predetermined arrangement for connection with a first type of microelectronic assembly in which the microelectronic element is configured to sample command and address information coupled thereto through the contacts at a first sampling rate, and in a second predetermined arrangement for connection with a second type of microelectronic assembly in which the microelectronic element is configured to sample the command and address information coupled thereto through a subset of the contacts at a second sampling rate greater than the first sampling rate.

30 Claims, 8 Drawing Sheets

(56) References Cited

U.S. PATENT DOCUMENTS

| | | | | |
|---|---|---|---|---|
| 5,148,265 | A | 9/1992 | Khandros et al. | |
| 5,148,266 | A | 9/1992 | Khandros et al. | |
| 5,163,024 | A | 11/1992 | Heilveil et al. | |
| 5,210,639 | A | 5/1993 | Redwine et al. | |
| 5,480,840 | A | 1/1996 | Barnes et al. | |
| 5,679,977 | A | 10/1997 | Khandros et al. | |
| 5,751,553 | A | 5/1998 | Clayton | |
| 5,777,391 | A | 7/1998 | Nakamura et al. | |
| 5,821,614 | A | 10/1998 | Hashimoto et al. | |
| 5,929,517 | A | 7/1999 | Distefano et al. | |
| 5,936,305 | A | 8/1999 | Akram | |
| 5,973,403 | A | 10/1999 | Wark | |
| 6,086,386 | A | 7/2000 | Fjelstad et al. | |
| 6,130,116 | A | 10/2000 | Smith et al. | |
| 6,197,665 | B1 | 3/2001 | DiStefano et al. | |
| 6,252,264 | B1 | 6/2001 | Bailey et al. | |
| 6,255,899 | B1 | 7/2001 | Bertin et al. | |
| 6,261,867 | B1 | 7/2001 | Robichaud et al. | |
| 6,297,960 | B1 | 10/2001 | Moden et al. | |
| 6,323,436 | B1 | 11/2001 | Hedrick et al. | |
| 6,343,019 | B1 | 1/2002 | Jiang et al. | |
| 6,376,769 | B1 | 4/2002 | Chung | |
| 6,380,318 | B1 | 4/2002 | Saito et al. | |
| 6,384,473 | B1 | 5/2002 | Peterson et al. | |
| 6,426,560 | B1 | 7/2002 | Kawamura et al. | |
| 6,433,422 | B1 | 8/2002 | Yamasaki | |
| 6,445,594 | B1 | 9/2002 | Nakagawa et al. | |
| 6,452,266 | B1 | 9/2002 | Iwaya et al. | |
| 6,461,895 | B1 | 10/2002 | Liang et al. | |
| 6,462,423 | B1 | 10/2002 | Akram et al. | |
| 6,577,004 | B1 | 6/2003 | Rumsey et al. | |
| 6,611,057 | B2 * | 8/2003 | Mikubo et al. | 257/714 |
| 6,617,695 | B1 | 9/2003 | Kasatani | |
| 6,619,973 | B2 | 9/2003 | Perino et al. | |
| 6,620,648 | B2 | 9/2003 | Yang | |
| 6,633,078 | B2 | 10/2003 | Hamaguchi et al. | |
| 6,661,089 | B2 | 12/2003 | Huang | |
| 6,692,987 | B2 | 2/2004 | Lim et al. | |
| 6,707,141 | B2 | 3/2004 | Akram | |
| 6,720,666 | B2 | 4/2004 | Lim et al. | |
| 6,742,098 | B1 | 5/2004 | Halbert et al. | |
| 6,744,137 | B2 | 6/2004 | Kinsman | |
| 6,765,288 | B2 * | 7/2004 | Damberg | 257/698 |
| 6,781,220 | B2 | 8/2004 | Taube et al. | |
| 6,821,815 | B2 | 11/2004 | Smith et al. | |
| 6,836,007 | B2 | 12/2004 | Michii et al. | |
| 6,876,088 | B2 | 4/2005 | Harvey | |
| 6,894,379 | B2 | 5/2005 | Feurle | |
| 6,894,381 | B2 | 5/2005 | Hetzel et al. | |
| 6,906,415 | B2 | 6/2005 | Jiang et al. | |
| 6,943,057 | B1 | 9/2005 | Shim et al. | |
| 6,977,440 | B2 * | 12/2005 | Pflughaupt et al. | 257/777 |
| 6,982,485 | B1 | 1/2006 | Lee et al. | |
| 7,061,092 | B2 | 6/2006 | Akram et al. | |
| 7,061,105 | B2 | 6/2006 | Masuda et al. | |
| 7,061,121 | B2 | 6/2006 | Haba | |
| 7,091,064 | B2 | 8/2006 | Jiang | |
| 7,123,497 | B2 * | 10/2006 | Matsui et al. | 365/51 |
| 7,138,709 | B2 | 11/2006 | Kumamoto | |
| 7,145,226 | B2 | 12/2006 | Kumamoto | |
| 7,151,319 | B2 | 12/2006 | Iida et al. | |
| 7,170,158 | B2 | 1/2007 | Choi et al. | |
| 7,262,507 | B2 | 8/2007 | Hino et al. | |
| 7,272,888 | B2 | 9/2007 | DiStefano | |
| 7,294,928 | B2 * | 11/2007 | Bang et al. | 257/737 |
| 7,324,352 | B2 | 1/2008 | Goodwin | |
| 7,368,319 | B2 | 5/2008 | Ha et al. | |
| 7,372,169 | B2 | 5/2008 | Chang | |
| 7,389,937 | B2 | 6/2008 | Ito | |
| 7,405,471 | B2 | 7/2008 | Kledzik et al. | |
| 7,414,312 | B2 | 8/2008 | Nguyen et al. | |
| 7,476,975 | B2 | 1/2009 | Ogata | |
| 7,518,226 | B2 | 4/2009 | Cablao et al. | |
| 7,535,110 | B2 | 5/2009 | Wu et al. | |
| 7,550,842 | B2 | 6/2009 | Khandros et al. | |
| 7,589,409 | B2 | 9/2009 | Gibson et al. | |
| 7,633,146 | B2 | 12/2009 | Masuda et al. | |
| 7,633,147 | B2 | 12/2009 | Funaba et al. | |
| 7,642,635 | B2 | 1/2010 | Kikuchi et al. | |
| 7,692,931 | B2 | 4/2010 | Chong et al. | |
| 7,763,964 | B2 | 7/2010 | Matsushima | |
| 7,763,969 | B2 | 7/2010 | Zeng et al. | |
| RE41,478 | E | 8/2010 | Nakamura et al. | |
| RE41,721 | E | 9/2010 | Nakamura et al. | |
| RE41,722 | E | 9/2010 | Nakamura et al. | |
| 7,795,721 | B2 | 9/2010 | Kurita | |
| RE41,972 | E | 11/2010 | Lenander et al. | |
| 7,989,940 | B2 | 8/2011 | Haba et al. | |
| RE42,972 | E | 11/2011 | Nakamura et al. | |
| 8,138,015 | B2 * | 3/2012 | Joseph et al. | 438/106 |
| 8,254,155 | B1 | 8/2012 | Crisp et al. | |
| 8,345,441 | B1 | 1/2013 | Crisp et al. | |
| 8,441,111 | B2 | 5/2013 | Crisp et al. | |
| 8,502,390 | B2 | 8/2013 | Crisp et al. | |
| 8,513,817 | B2 | 8/2013 | Haba et al. | |
| 2001/0002727 | A1 | 6/2001 | Shiraishi et al. | |
| 2001/0022740 | A1 | 9/2001 | Nuxoll et al. | |
| 2001/0038106 | A1 | 11/2001 | Coteus et al. | |
| 2002/0000583 | A1 | 1/2002 | Kitsukawa et al. | |
| 2002/0016056 | A1 | 2/2002 | Corisis | |
| 2002/0027019 | A1 | 3/2002 | Hashimoto | |
| 2002/0030261 | A1 | 3/2002 | Rolda et al. | |
| 2002/0053727 | A1 | 5/2002 | Kimura | |
| 2002/0053732 | A1 | 5/2002 | Iwaya et al. | |
| 2002/0066950 | A1 | 6/2002 | Joshi | |
| 2002/0171142 | A1 | 11/2002 | Kinsman | |
| 2003/0064547 | A1 | 4/2003 | Akram et al. | |
| 2003/0089978 | A1 | 5/2003 | Miyamoto et al. | |
| 2003/0089982 | A1 | 5/2003 | Feurle | |
| 2003/0107908 | A1 | 6/2003 | Jang et al. | |
| 2003/0205801 | A1 | 11/2003 | Baik et al. | |
| 2003/0211660 | A1 | 11/2003 | Lim et al. | |
| 2004/0016999 | A1 | 1/2004 | Misumi | |
| 2004/0061211 | A1 | 4/2004 | Michii et al. | |
| 2004/0061577 | A1 * | 4/2004 | Breisch et al. | 333/247 |
| 2004/0090756 | A1 | 5/2004 | Ho et al. | |
| 2004/0112088 | A1 | 6/2004 | Ueda et al. | |
| 2004/0145042 | A1 | 7/2004 | Morita et al. | |
| 2004/0164382 | A1 | 8/2004 | Gerber et al. | |
| 2004/0168826 | A1 * | 9/2004 | Jiang et al. | 174/261 |
| 2004/0184240 | A1 | 9/2004 | Su | |
| 2005/0116358 | A1 | 6/2005 | Haba | |
| 2005/0194672 | A1 | 9/2005 | Gibson et al. | |
| 2005/0206585 | A1 | 9/2005 | Stewart et al. | |
| 2005/0243590 | A1 | 11/2005 | Lee et al. | |
| 2005/0258532 | A1 | 11/2005 | Yoshikawa et al. | |
| 2006/0004981 | A1 | 1/2006 | Bains | |
| 2006/0081983 | A1 | 4/2006 | Humpston et al. | |
| 2006/0207788 | A1 | 9/2006 | Yoon et al. | |
| 2006/0290005 | A1 | 12/2006 | Thomas et al. | |
| 2007/0025131 | A1 | 2/2007 | Ruckerbauer et al. | |
| 2007/0108592 | A1 | 5/2007 | Lai et al. | |
| 2007/0120245 | A1 | 5/2007 | Yoshikawa et al. | |
| 2007/0143553 | A1 | 6/2007 | LaBerge | |
| 2007/0187836 | A1 | 8/2007 | Lyne | |
| 2007/0241441 | A1 | 10/2007 | Choi et al. | |
| 2007/0260841 | A1 | 11/2007 | Hampel et al. | |
| 2008/0012110 | A1 | 1/2008 | Chong et al. | |
| 2008/0052462 | A1 * | 2/2008 | Blakely et al. | 711/115 |
| 2008/0061423 | A1 | 3/2008 | Brox et al. | |
| 2008/0088033 | A1 | 4/2008 | Humpston et al. | |
| 2008/0098277 | A1 | 4/2008 | Hazelzet | |
| 2008/0150155 | A1 | 6/2008 | Periaman et al. | |
| 2008/0182443 | A1 | 7/2008 | Beaman et al. | |
| 2008/0185705 | A1 | 8/2008 | Osborn et al. | |
| 2008/0230888 | A1 | 9/2008 | Sasaki | |
| 2008/0256281 | A1 * | 10/2008 | Fahr et al. | 710/305 |
| 2008/0265397 | A1 | 10/2008 | Lin et al. | |
| 2009/0065948 | A1 | 3/2009 | Wang | |
| 2009/0108425 | A1 | 4/2009 | Lee et al. | |
| 2009/0200680 | A1 | 8/2009 | Shinohara et al. | |
| 2009/0250255 | A1 | 10/2009 | Shilling et al. | |
| 2009/0250822 | A1 | 10/2009 | Chen et al. | |
| 2009/0294938 | A1 | 12/2009 | Chen | |

(56) References Cited

U.S. PATENT DOCUMENTS

| | | | |
|---|---|---|---|
| 2009/0314538 | A1 | 12/2009 | Jomaa et al. |
| 2010/0052111 | A1 | 3/2010 | Urakawa |
| 2010/0102428 | A1 | 4/2010 | Lee et al. |
| 2010/0182040 | A1 | 7/2010 | Feng et al. |
| 2010/0244272 | A1 | 9/2010 | Lee et al. |
| 2010/0244278 | A1 | 9/2010 | Shen |
| 2010/0295166 | A1 | 11/2010 | Kim |
| 2010/0301466 | A1 | 12/2010 | Taoka et al. |
| 2010/0327457 | A1 | 12/2010 | Mabuchi |
| 2011/0042824 | A1 | 2/2011 | Koide |
| 2011/0193178 | A1 | 8/2011 | Chang et al. |
| 2011/0193226 | A1 | 8/2011 | Kirby et al. |
| 2011/0254156 | A1 | 10/2011 | Lin |
| 2012/0018863 | A1 | 1/2012 | Oganesian et al. |
| 2012/0020026 | A1 | 1/2012 | Oganesian et al. |

FOREIGN PATENT DOCUMENTS

| | | | |
|---|---|---|---|
| JP | 2004-063767 | A | 2/2004 |
| JP | 2008-198841 | A | 8/2008 |
| JP | 3143893 | U | 8/2008 |
| JP | 2010-098098 | A | 4/2010 |
| KR | 2001-0002214 | A | 1/2001 |
| KR | 2005-0119414 | A | 12/2005 |
| KR | 2006-0120365 | A | 11/2006 |
| KR | 2007-0088177 | A | 8/2007 |
| KR | 2009-0008341 | A | 1/2009 |
| KR | 2009-0086314 | A | 8/2009 |
| TW | M338433 | U | 8/2008 |
| WO | 2010120310 | A1 | 10/2010 |

OTHER PUBLICATIONS

U.S. Appl. No. 13/354,747, filed Jan. 20, 2012.
U.S. Appl. No. 13/354,772, filed Jan. 20, 2012.
U.S. Appl. No. 13/439,286, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/440,313, filed Apr. 5, 2012.
US Non Final Office Action dated Oct. 18, 2012 for U.S. Appl. No. 13/439,299.
US Non-Final Office Action for U.S. Appl. No. 13/440,199 dated Aug. 31, 2012.
US Non-Final Office Action for U.S. Appl. No. 13/440,280 dated Aug. 31, 2012.
Elpida User's Manual, "Introduction to GDDR5 SGRAM", Document No. E1600E10 (Ver. 1.0), Published Mar. 2010, Japan, URL: http:www.elpida.com.
Hynix, "2GB (64Mx32) GDDR5 SGRAM HRGQ2H24AFR", Nov. 2011-Feb. 2012.
International Search Report and Written Opinion dated Mar. 21, 2013 for Application No. PCT/US2012/000425.
International Search Report and Written Opinion dated Mar. 21, 2013 for Application No. PCT/US2012/057911.
International Search Report and Written Opinion for Application No. PCT/US2012/046049 dated Jan. 10, 2013.
International Search Report and Written Opinion for Application No. PCT/US2012/046049 dated Nov. 29, 2012.
International Search Report and Written Opinion for Application No. PCT/US2012/046249 dated Mar. 20, 2013.
International Search Report and Written Opinion for Application No. PCT/US2012/046255 dated Mar. 20, 2013.
International Search Report and Written Opinion for Application No. PCT/US2012/057170 dated Mar. 22, 2013.
International Search Report and Written Opinion for Application No. PCT/US2012/057179 dated Apr. 4, 2013.
International Search Report and Written Opinion for Application No. PCT/US2012/057200 dated Mar. 1, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/058273 dated Mar. 6, 2013.
International Search Report and Written Opinion for Application No. PCT/US2012/058398 dated Jul. 4, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058434 dated Jun. 21, 2013.
International Search Report and Written Opinion for Application No. PCT/US2012/058557 dated Mar. 12, 2013.
International Search Report and Written Opinion for Application No. PCT/US2012/057895 dated Jun. 10, 2013.
International Search Report and Written Opinion for Application No. PCT/US2012/058229 dated Jul. 3, 2013.
Kang, et al., 8Gb 3D DDR3 DRAM Using Through-Silicon-Via Technology, IEEE, International Solid-State Circuits Conference, 2009, pp. 130-132.
Kang, et al., 8Gb 3D DDR3 DRAM Using Through-Silicon-Via Technology, IEEE, International Solid-State Circuits Conference, 2009, Samsung Electronics, Hwasung, Korea.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
Partial International Search Report dated Oct. 26, 2012 in International Patent Appl. No. PCT/US2012/046049.
Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2013.
Sandforce, "SF-2200 & SF-2100 Client SSD Processors", 2011.
US Amendment for U.S. Appl. No. 13/439,299 dated Jan. 18, 2013.
US Amendment for U.S. Appl. No. 13/440,199 dated Nov. 30, 2012.
US Amendment for U.S. Appl. No. 13/440,280 dated Nov. 30, 2012.
U.S. Appl. No. 13/080,876, filed Apr. 6, 2011.
U.S. Appl. No. 13/306,300, filed Nov. 29, 2011.
U.S. Appl. No. 13/337,565, filed Dec. 27, 2011.
U.S. Appl. No. 13/337,575, filed Dec. 27, 2011.
U.S. Appl. No. 13/346,185, filed Jan. 9, 2012.
U.S. Appl. No. 13/439,228, filed Apr. 4, 2012.
U.S. Appl. No. 13/439,273, filed Apr. 4, 2012.
U.S. Appl. No. 13/439,299, filed Apr. 4, 2012.
U.S. Appl. No. 13/439,354, filed Apr. 4, 2012.
U.S. Appl. No. 13/440,199, filed Apr. 5, 2012.
U.S. Appl. No. 13/440,280, filed Apr. 5, 2012.
U.S. Appl. No. 13/440,290, filed Apr. 5, 2012.
U.S. Appl. No. 13/440,515, filed Apr. 5, 2012.
U.S. Appl. No. 13/440,299, filed Apr. 5, 2012
U.S. Appl. No. 13/840,353, filed Mar. 15, 2013.
U.S. Appl. No. 13/840,542, filed Mar. 15, 2013.
U.S. Appl. No. 13/841,052, filed Mar. 15, 2013.
U.S. Appl. No. 13/306,068, filed Nov. 29, 2011.
International Search Report and Written Opinion for Application No. PCT/US2013/056773 dated Dec. 4, 2013.
International Search Report and Written Opinion for Application PCT/US2013/056777 dated Jan. 2, 2014.

* cited by examiner

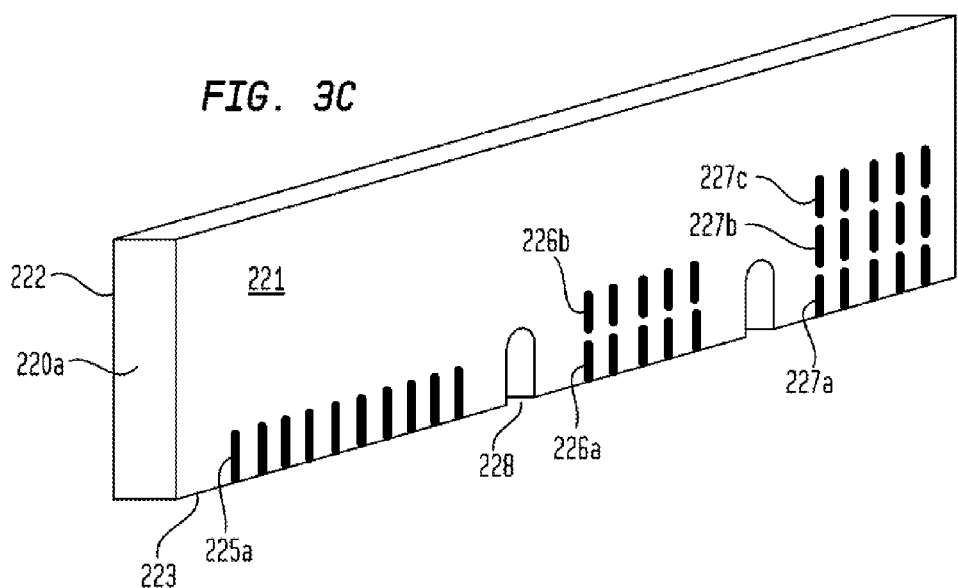
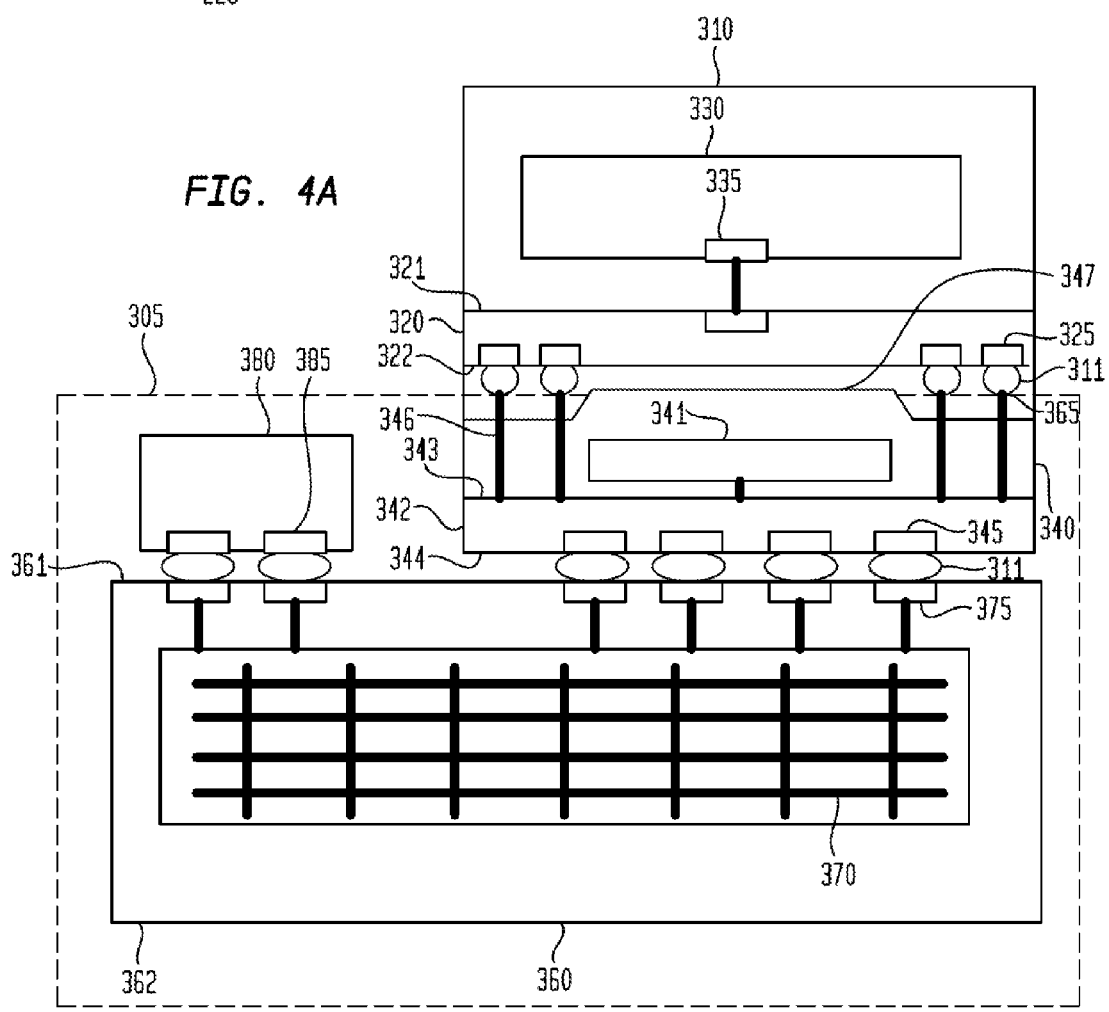

CO-SUPPORT SYSTEM AND MICROELECTRONIC ASSEMBLY

CROSS-REFERENCE TO RELATED APPLICATION

This application is a continuation-in-part of U.S. patent application Ser. No. 13/595,486, filed Aug. 27, 2012, the disclosure of which is hereby incorporated herein by reference. The following co-owned and co-pending U.S. patent applications are hereby incorporated herein by reference: U.S. patent application Ser. Nos. 13/840,353, 13/840,542, and 13/841,052, each filed Mar. 15, 2013.

BACKGROUND OF THE INVENTION

The subject matter of the present application relates to microelectronic structures, e.g., structures incorporating active circuit elements, such as, without limitation, structures including at least one semiconductor chip or portion of at least one semiconductor chip, as well as assemblies incorporating microelectronic structures.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Microelectronic elements such as semiconductor chips which contain memory storage arrays, particularly dynamic random access memory chips (DRAMs) and flash memory chips, are commonly packaged in single- or multiple-chip packages and assemblies. Each package has many electrical connections for carrying signals, power and ground between terminals and the microelectronic elements, e.g., chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

Conventional microelectronic packages can incorporate a microelectronic element having active elements defining a memory storage array. Thus, in some conventional microelectronic elements, transistors or other active elements, constitute a memory storage array with or without additional elements. In some cases, the microelectronic element can be configured to predominantly provide memory storage array function, i.e., in which case microelectronic element may embody a greater number of active elements to provide memory storage array function than any other function. In some cases, a microelectronic element may be or include a DRAM chip, or may be or include a stacked electrically interconnected assembly of such semiconductor chips. Typically, all of the terminals of such package are placed in sets of columns adjacent to one or more peripheral edges of a package substrate to which the microelectronic element is mounted.

Conventional circuit panels or other microelectronic components are typically configured to be coupled to a microelectronic package having one or more first type microelectronic elements therein. Such circuit panels or other microelectronic components typically cannot be coupled to a microelectronic package having one or more microelectronic elements therein that are of a different or second type.

In light of the foregoing, certain improvements in the design of circuit panels or other microelectronic components can be made in order to improve the functional flexibility thereof, particularly in circuit panels or other microelectronic components to which packages can be mounted and electrically interconnected with one another.

SUMMARY OF THE INVENTION

In accordance with an aspect of the invention, a system can include a microelectronic assembly which includes a set of terminals and a microelectronic element having a memory storage array having a given number of storage locations, the microelectronic element of the assembly having inputs connected with the terminals for receiving command and address information specifying one of the storage locations, and a component for connection with the microelectronic assembly. The component can include a support structure bearing a set of conductors configured to carry the command and address information, and a plurality of contacts coupled to the set of conductors, the contacts electrically connected with corresponding ones of the terminals of the microelectronic assembly.

The contacts can have address and command information assignments arranged according to a first predetermined arrangement for connection with a first type of the microelectronic assembly in which the microelectronic element is configured to sample the command and address information coupled thereto through the contacts at a first sampling rate, the contacts having a first number thereof. The contacts can have address and command information assignments arranged according to a second predetermined arrangement for connection with a second type of the microelectronic assembly in which the microelectronic element is configured to sample the command and address information coupled thereto through a subset of the contacts including a second number of the contacts at a second sampling rate being greater than the first sampling rate, the subset including some contacts occupying identical positions with the contacts that are assigned to the first predetermined arrangement, the second number being fewer than the first number.

In one example, all of the contacts of the subset of contacts arranged according to the second predetermined arrangement can occupy identical positions with the contacts that are assigned to the first predetermined arrangement. In one embodiment, the second sampling rate can be an integer multiple of the first sampling rate. In a particular example, the system can also include a device coupled to the set of conductors, the device being operable to drive the command and address information to the contacts. In an exemplary embodiment, the device can be a microprocessor. In one example, the device can be configured to operate in each of first and second modes for connection of the component with the first type microelectronic assembly via the first arrangement, and with the second type microelectronic assembly via the second arrangement, respectively. In a particular embodiment, the system can also include at least one central processing unit ("CPU"). The CPU can be configured to control operations of a plurality of components in the system including read operations from the microelectronic assembly and write operations to the microelectronic assembly.

In a particular example, the system can also include a power supply configured to supply power for use by the component and the microelectronic assembly. In one embodiment, the microelectronic assembly can be the first type microelectronic assembly. In an exemplary embodiment, the microelectronic assembly can be the second type microelectronic assembly. In one example, the component can be a circuit panel, and the contacts can be exposed at a surface of the circuit panel. In a particular embodiment, the microelectronic assembly can be a microelectronic package. The terminals can be surface mount terminals exposed at a surface of the microelectronic package.

In an exemplary embodiment, the circuit panel can be a motherboard. In one embodiment, the circuit panel can be a module card, the module card including one or more rows of exposed module contacts, at least one of the rows of module contacts disposed adjacent an edge of the first or second surfaces for mating with contacts of a socket of a second circuit panel when the module is inserted in the socket. In a particular example, the component can be a circuit panel, and the contacts can be disposed in a socket electrically connected with the circuit panel. In one example, the microelectronic assembly can include a module card having first and second opposed surfaces. The terminals can be a plurality of parallel exposed terminals adjacent an edge of at least one of the first and second surfaces for mating with the contacts of the socket when the module is inserted in the socket.

In a particular embodiment, the component can be a circuit panel and the contacts can be disposed in a connector electrically connected with the circuit panel. The microelectronic assembly can include a module card having first and second opposed surfaces. The terminals can be a plurality of parallel terminals exposed at one of the first and second surfaces for mating with the contacts of the connector when the module is attached to the connector. In one embodiment, the microelectronic assembly can be a first microelectronic assembly and the component can be a second microelectronic assembly, and the contacts can be terminals of the second microelectronic assembly.

In a particular example, the second microelectronic assembly can be coupled to the support structure and includes a microelectronic element having active devices therein. The microelectronic element of the first microelectronic assembly can be coupled with the microelectronic element of the second microelectronic assembly by electrical connections that extend only within the first and second microelectronic assemblies. In an exemplary embodiment, the electrical connections between the microelectronic element of the first microelectronic assembly and the microelectronic element of the second microelectronic assembly can include interconnection elements extending in a direction normal to a surface of the second microelectronic assembly at which the terminals of the second microelectronic assembly are exposed. The interconnection elements can be configured for package-on-package stacking.

In one example, the electrical connections between the microelectronic element of the first microelectronic assembly and the microelectronic element of the second microelectronic assembly can include a bond via array extending from the terminals of the second microelectronic assembly to contacts exposed at a surface of a substrate of the second microelectronic assembly. In a particular embodiment, the second microelectronic assembly can be coupled to the support structure and includes a microelectronic element having active devices therein, the terminals of the second microelectronic assembly being exposed at a surface of the microelectronic element of the second microelectronic assembly.

In one embodiment, the microelectronic element of the second microelectronic assembly can be a first microelectronic element. The second microelectronic assembly can also include at least one second microelectronic element each having active devices therein. The first and second microelectronic elements can be arranged in a stacked configuration. In a particular example, the terminals of the second microelectronic assembly can be electrically connected with the set of conductors of the support structures by through-silicon vias extending through the at least one second microelectronic element.

In an exemplary embodiment, the microelectronic element of the second microelectronic assembly can include a logic function. In one example, the contacts can be first contacts and the conductors can be a first set of conductors. The component can also include a plurality of second contacts coupled to a second set of conductors. The second contacts can be configured for connection with corresponding terminals of the microelectronic assembly. The second contacts can be configured to carry information other than the command and address information.

In a particular embodiment, the microelectronic element in the first type of the microelectronic assembly can be of type DDRx. In one embodiment, the microelectronic element in the second type of the microelectronic assembly can be of type LPDDRx. In a particular example, the microelectronic element in the first type of the microelectronic assembly can be of type GDDRx. In an exemplary embodiment, a system as described above can include one or more other electronic components electrically connected to the component. In one example, the system can include a housing, the component and the one or more other electronic components being assembled with the housing.

In accordance with another aspect of the invention, a system can include a microelectronic assembly which includes a set of terminals and a microelectronic element having a memory storage array having a given number of storage locations, the microelectronic element of the assembly having inputs connected with the terminals for receiving command and address information specifying one of the storage locations, and a component for connection with the microelectronic assembly. The component can include a support structure bearing a set of conductors configured to carry the command and address information, and a plurality of contacts coupled to the set of conductors, the contacts electrically connected with corresponding ones of the terminals of the microelectronic assembly.

The contacts can have address and command information assignments arranged according to a first predetermined arrangement for connection with a first type of the microelectronic assembly in which the microelectronic element is configured to sample the command and address information coupled thereto through a first subset of the contacts including a first number of the contacts. The contacts can have address and command information assignments arranged according to a second predetermined arrangement for connection with a second type of the microelectronic assembly in which the microelectronic element is configured to sample the command and address information coupled thereto through a second subset of the contacts including a second number of the contacts, the first and second subsets including some contacts occupying identical positions, the second number being fewer than the first number.

In one example, the command and address information of the first type of the microelectronic assembly can include parity information, the microelectronic element in the first type of the microelectronic assembly can be configured to sample the parity information, and the second subset of the contacts for connection with the second type of the microelectronic assembly may not be configured to sample the parity information. In an exemplary embodiment, the microelectronic element in the second type of the microelectronic assembly can be of type DDR3, and the microelectronic element in the first type of the microelectronic assembly can be of type DDR4.

In one embodiment, the command and address information of the first type of the microelectronic assembly having the DDR4 type microelectronic element can include parity information, and the DDR4 type microelectronic element in the first type of the microelectronic assembly can be configured to sample the parity information. In a particular example, the microelectronic element in the second type of the microelectronic assembly can be of type DDRx, and the microelectronic element in the first type of the microelectronic assembly can be of type DDR(x+1).

BRIEF DESCRIPTION OF THE DRAWINGS

FIG. 3C is a perspective view illustrating the module card of FIG. 3A having various potential configurations of terminals.

FIG. 4A is a side sectional view illustrating a component having a package-on-package structure and a circuit panel according to an embodiment of the invention.

DETAILED DESCRIPTION

Figure 1:
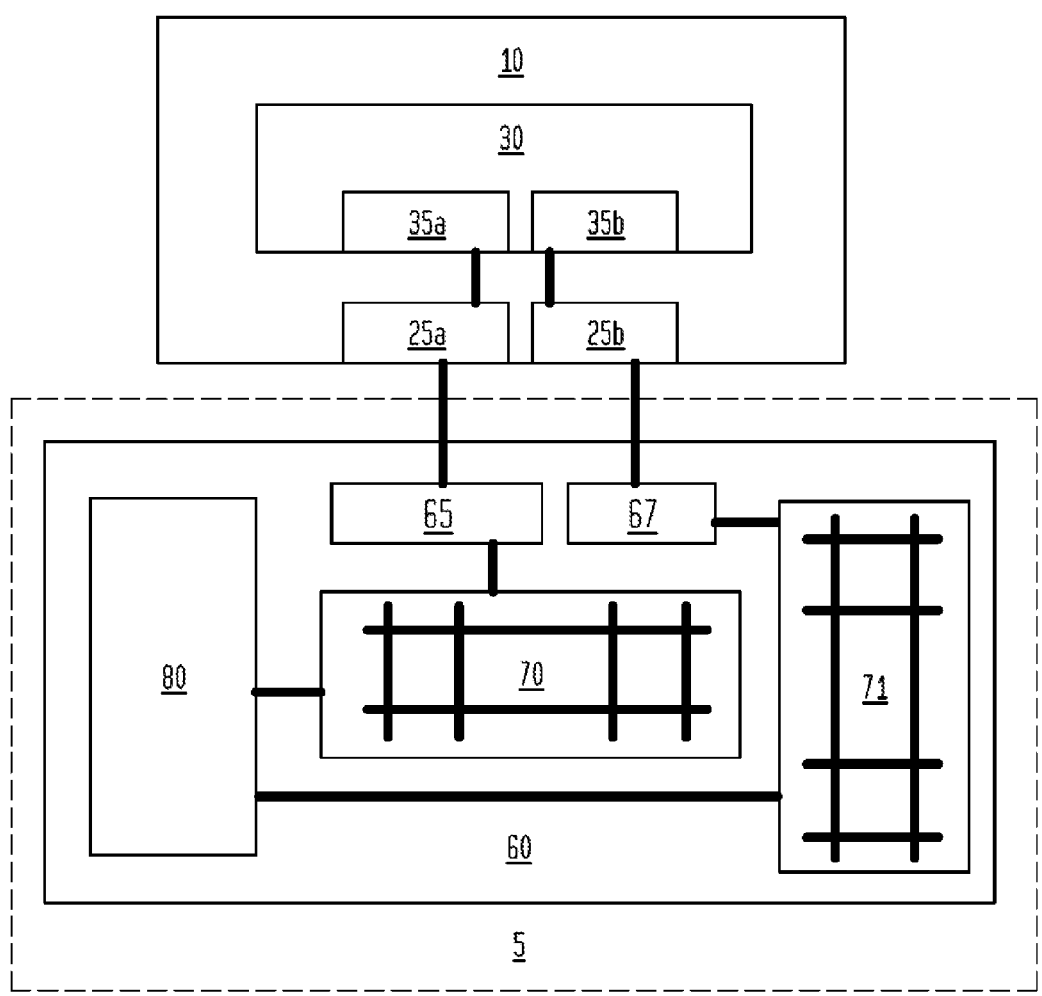
FIG. 1 is a schematic view illustrating a component according to an embodiment of the invention.

A component 5 according to an embodiment of the invention is illustrated in FIG. 1. As seen in FIG. 1, the component 5 is configured to be connected with a microelectronic assembly 10.

The microelectronic assembly 10 includes a set of terminals 25 and a microelectronic element 30 having a memory storage array having a given number of storage locations. The microelectronic element 30 has element contacts 35 including inputs 35a connected with the terminals 25 for receiving command and address information specifying one of the storage locations, and other element contacts 35b for sending and receiving information other than the command and address information (e.g., data information). The microelectronic assembly 10 can take various forms, for example, as described below with reference to FIGS. 2-5.

The microelectronic assembly 10 can include active elements, e.g., active devices such as transistors, or other active elements thereon, which, with or without additional elements, define a memory storage array. In one example, the active elements and the memory storage array defined by the active elements can be incorporated in a portion of a microelectronic element 30, or in one or more microelectronic elements, e.g., one or more semiconductor chips, of the microelectronic assembly 10, or may be incorporated in one or more microelectronic packages of the microelectronic assembly.

Without limitation, in one example, the microelectronic assembly 10 may be, for example, a microelectronic package or portion thereof wherein the terminals 25 are exposed at a surface of the microelectronic package. In another example, the microelectronic assembly can include a plurality of electrically connected microelectronic packages or a structure that includes electrically connected microelectronic elements, semiconductor chips, or portions of microelectronic elements or semiconductor chips, or portions of microelectronic packages.

As used herein, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure.

In one example, the memory storage array of the one or more microelectronic elements 30 comprises a functional part of the microelectronic assembly 10 whose role may be subservient to another functional part of the microelectronic assembly. For example, the microelectronic assembly 10 may include a logic functional part, e.g., processor, and a memory functional part, and the memory functional part may assist with or help serve a function of the logic functional part. However, in a particular example, the microelectronic assembly 10 may be configured to predominantly provide memory storage array function. In the latter case, the microelectronic assembly 10 may have a greater number of active elements, e.g., active devices such as transistors, configured to provide memory storage array function than the number of active elements in other components of the microelectronic assembly that are configured to provide function other than memory storage array function.

In one example, the microelectronic assembly 10 may contain wiring therein that directly electrically couples a set of the terminals 25, e.g., "first terminals" 25a, with corresponding address inputs 35a of the microelectronic element 30. As used herein, each "first terminal" 25a has a signal assignment on the microelectronic assembly 10 that includes one or more of the address inputs 35a. In another example, as further described below, the microelectronic assembly 10 may include a buffer element, such as a semiconductor chip having a plurality of active elements thereon, such semiconductor chip being configured to at least one of regenerate, or partially or fully decode at least one of address or command information received at the terminals 25 for transfer by the microelectronic structure to the address inputs. Command information may be information that controls an operating mode of a memory storage array or portion thereof within the microelectronic assembly 10.

The microelectronic assembly 10 is configured to provide address information received at the first terminals 25a to the address inputs 35a of the one or more microelectronic elements 30. As used herein in the context of address information or command address bus information or signals and the address inputs of a microelectronic element or portion thereof, a statement that address information on terminals is "provided to address inputs" means that the address information on the terminals is transferred to the address inputs via electrical connections therewith, or through a buffer element which may perform at least one of regenerating, partially decoding or decoding of the address information received at the terminals.

In one type of such microelectronic element 30, each one of some contacts of the address inputs 35a may be configured to receive particular address information of the address information supplied to the microelectronic element. In a particular embodiment, each of such contacts may be an address input 35a configured to receive address information, supplied to the microelectronic element 30 from outside the microelectronic element, i.e., through wiring of the microelectronic package 10 such as wire bonds, and through the first terminals 25a. Contacts of the microelectronic elements 30 may also be configured to receive other information or signals from outside the microelectronic element.

For example, when the microelectronic element 30 includes or is a DRAM semiconductor chip, the first terminals 25a can be configured to carry address information transferred to the microelectronic assembly 10 that is usable by circuitry within the microelectronic assembly, e.g., row address and column address decoders, and bank selection circuitry, if present, to determine an addressable memory location from among all the available addressable memory locations of a memory storage array within a microelectronic element in the microelectronic assembly. In a particular embodiment, the first terminals 25a can be configured to carry all the address information used by such circuitry within the microelectronic assembly 10 to determine an addressable memory location within such memory storage array. Each of the first terminals 25a can be configured to carry address information sufficient to specify a location within the memory storage array of the microelectronic assembly 10.

Typically, when the microelectronic element 30 in the microelectronic assembly 10 is or includes a DRAM chip, the address information in one embodiment can include all address information transferred to the microelectronic assembly from a component external to the microelectronic structure, e.g., the component 5, which is used for determining a random access addressable memory location within the microelectronic assembly for read access thereto, or for either read or write access thereto.

In a particular embodiment, the first terminals 25a can be configured to carry information that controls an operating mode of one or more of the microelectronic elements 30. More specifically, the first terminals 25a can be configured to carry all of a particular set of command signals and/or clock signals transferred to the microelectronic assembly 10. In one embodiment, the first terminals 25a can be configured to carry all of the command signals, address signals, bank address signals, and clock signals transferred to the assembly 10 from an external component, e.g., the component 5, wherein the command signals include row address strobe, column address strobe and write enable.

In an embodiment in which one or more of the microelectronic elements 30 are configured to provide dynamic memory storage array function, such as provided by a dynamic random access memory ("DRAM") semiconductor chip, or an assembly of DRAM chips, the command signals can be write enable, row address strobe, and column address strobe signals. Other signals such as ODT (on die termination), chip select, clock enable, may or may not be carried by the first terminals 25a. The clock signals can be clocks used by one or more of the microelectronic elements for sampling the address signals.

In addition to the first terminals 25a, the terminals (or the terminals in any of the other embodiments described herein) can also include second terminals 25b that are configured to carry (send and/or receive) information other than the command and address information, such as data signals. At least some of the second terminals 25b can be configured to carry signals other than the address signals that are carried by the first terminals 25a. In particular examples, the second terminals 25b may carry one or more of data, data strobe signals, or other signals or reference potentials such as chip select, reset, power supply voltages, e.g., Vdd, Vddq, and ground, e.g., Vss and Vssq. The second terminals 25b may be electrically connected with the other element contacts 35b for sending and receiving information other than the command and address information.

In one example, the second terminals 25b can include terminals used for carrying uni-directional or bi-directional data signals to and or from the microelectronic elements 30, and data strobe signals, as well as data masks and ODT or "on die termination" signals used to turn on or off parallel terminations to termination resistors. In particular examples, the second terminals 25b may carry signals such as reset, as well as reference potentials such as power supply voltages, e.g., Vdd, Vddq, or ground, e.g., Vss and Vssq.

In one particular example of such microelectronic element 30, the command and address information present at the element contacts 35*a* can be sampled relative to an edge of a clock used by the respective microelectronic element, i.e., upon on a transition of the clock between first and second different voltage states. That is, each command and address signal can be sampled upon a rising transition between a lower voltage state and a higher voltage state of the clock, or upon a falling transition between a higher voltage state and a lower voltage state of the clock. Thus, the plurality of command and address signals may all be sampled upon the rising transition of the clock, or such command and address signals may all be sampled upon the falling transition of the clock, or in another example, the command or address signal at one of the element contacts 35*a* can be sampled upon the rising transition of the clock and the command or address signal at one other external contact can be sampled upon the falling transition of the clock.

In another type of microelectronic element 30, which may be configured to predominantly provide memory storage array function, one or more of the command or address address contacts 35*a* thereon can be used in a multiplexed manner. In this example, a particular element contact 35*a* of the respective microelectronic element 30 can receive two or more different signals supplied to the microelectronic element from the outside. Thus, a first command or address address signal can be sampled at the particular contact 35*a* upon a first transition of the clock between the first and second different voltage states (e.g., a rising transition), and a signal other than the first command or address address signal can be sampled at the particular contact upon a second transition of the clock (e.g., a falling transition) between the first and second voltage states that is opposite the first transition.

In such a multiplexed manner, two different signals can be received within the same cycle of the clock on the same element contact 35*a* of the respective microelectronic element 30. In a particular case, multiplexing in this manner can allow a first address command or address signal and a different signal to be received in the same clock cycle on the same element contact 35*a* of the respective microelectronic element 30. In yet another example, multiplexing in this manner can allow a first command or address signal and a second different command or address signal to be received in the same clock cycle on the same element contact 35*a* of the respective microelectronic element 30.

In one example, the operational parameters may pertain to timing such as the number of clock cycles of latency after the row address strobe signal is detected in an enabled state by circuitry of the microelectronic assembly 10 (hereinafter, "RAS latency"), or may pertain to the number of clock cycles of latency after the column address strobe signal is detected in an enabled state by circuitry of the microelectronic assembly, or may pertain to the capacity of the microelectronic assembly, e.g., such as one gigabit ("1 Gb"), two gigabit ("2 Gb"), etc., or may pertain to the organization of the microelectronic assembly, such as a "single-rank", "2-rank", "4-rank" or other structure, etc., or other operating parameter, or a combination of the foregoing operational parameters, or other operating parameter. In one example, the nonvolatile memory may store information of a single one of the aforementioned parameters or may store information of any combination of the operational parameters, without limitation. In a particular example, the nonvolatile memory may contain a table of known bad memory locations within the memory storage array of the microelectronic assembly 10 which should be avoided during read or write access to the memory storage array.

The component 5 includes a support structure 60 (e.g., a circuit panel) bearing a first set of conductors 70 configured to carry the command and address information. The support structure 60 can take many different forms, such as a circuit panel 160 (FIG. 2A), a module card 160*b* (FIG. 2B), an interconnection substrate 342 (FIG. 4B), a molded region 348 (FIG. 4C), a microelectronic element 440 (FIG. 5B), or a dielectric layer overlying a microelectronic element (not shown), among others.

The component 5 also includes a plurality of first contacts 65 coupled to the set of conductors 70 and configured for connection with corresponding ones of the terminals 25 of the microelectronic assembly 10. The first set of conductors 70 can include at least one bus having a plurality of signal lines configured to carry all of the address information transferred to the first contacts 65. The first contacts 65 can be electrically connected with the at least one bus of the first set of conductors 70.

The connection between the contacts 65 of the component 5 and the terminals 25 of the microelectronic assembly 10 can take various forms, for example, as described below with reference to FIGS. 2-5. The contacts 65 have a plurality of predetermined arrangements of address and command information assignments, so that the contacts can be connected with terminals 25 of a microelectronic assembly 10 having one or more microelectronic elements 30 of a plurality of types (e.g., DDRx, GDDRx, LPDDRx, etc.).

The contacts 65 are arranged according to a first predetermined arrangement for connection with a first type of the microelectronic assembly 10 in which the one or more microelectronic elements 30 are configured to sample the command and address information coupled thereto through a first subset of the contacts including a first number of the contacts (which may be some or all of the contacts) at a first sampling rate (e.g., DDR3 or DDR4). The same contacts 65 are arranged according to a second predetermined arrangement for connection with a second type of microelectronic assembly 10 in which the one or more microelectronic elements 30 are configured to sample the command and address information coupled thereto through a second subset of the contacts including a second number of the contacts fewer than the first number at a second sampling rate being greater than the first sampling rate (e.g., LPDDR3). The first and second subsets of the contacts 65 include some contacts occupying identical positions. The contacts 65 that can be arranged according to two different predetermined arrangements for connection with two different types of the microelectronic assembly 10, respectively, are also referred to herein as "co-support contacts."

In a particular embodiment, the second sampling rate can be an integer multiple of the first sampling rate. For example, the component 5 may be configured such that when a first type of the microelectronic assembly 10 having DDR3 or DDR4 memory therein is attached to the component, the microelectronic elements 30 in the microelectronic assembly can be configured to sample the command and address information coupled thereto through a first number of the contacts 65 at a first sampling rate, such as once per clock cycle (e.g., on the rising edge of the clock cycle). In this same example, the component 5 may be configured such that when a second type of the microelectronic assembly 10 having LPDDR3 memory therein is attached to the component, the microelectronic elements 30 in the microelectronic assembly can be configured to sample the command and address information coupled thereto through a second number of the contacts 65 at a second sampling rate, such as twice per clock cycle (e.g., once each on the rising edge and falling edge of the clock cycle). Therefore, in this example, the second sampling rate is an integer multiple (2) of the first sampling rate.

In another embodiment where the second sampling rate is an integer multiple of the first sampling rate, the component 5 may be configured such that when a first type of the microelectronic assembly 10 having DDR3 or DDR4 memory therein is attached to the component, the microelectronic elements 30 in the microelectronic assembly can be configured to sample the command and address information coupled thereto through a first number of the contacts 65 at a first sampling rate of once per clock cycle. In this same example, the component 5 may be configured such that when a second type of the microelectronic assembly 10 having a different type of memory therein is attached to the component, the microelectronic elements 30 in the microelectronic assembly can be configured to sample the command and address information coupled thereto through a second number of the contacts 65 at a second sampling rate of four times per clock cycle (e.g., once each on every quarter of the clock cycle). Therefore, in this example, the second sampling rate is also an integer multiple (4) of the first sampling rate.

In yet another embodiment, the second sampling rate can be a non-integer multiple of the first sampling rate. For example, the component 5 may be configured such that when a first type of the microelectronic assembly 10 having memory therein is attached to the component, the microelectronic elements 30 in the microelectronic assembly can be configured to sample the command and address information coupled thereto through a first number of the contacts 65 at a first sampling rate of four times per clock cycle (e.g., once each on every quarter of the clock cycle). In this same example, the component 5 may be configured such that when a second type of the microelectronic assembly 10 having memory therein is attached to the component, the microelectronic elements 30 in the microelectronic assembly can be configured to sample the command and address information coupled thereto through a second number of the contacts 65 at a second sampling rate of six times per clock cycle (e.g., once each on every sixth of the clock cycle). Therefore, in this example, the second sampling rate is a non-integer multiple (1.5) of the first sampling rate.

In another embodiment where the second sampling rate is a non-integer multiple of the first sampling rate, such a non-integer relationship between the first and second sampling rates can occur when sampling of the command and address information by the microelectronic elements 30 is only performed during some clock cycles but not other clock cycles. For example, the component 5 may be configured such that when a first type of the microelectronic assembly 10 having DDR3 or DDR4 memory therein is attached to the component, the microelectronic elements 30 in the microelectronic assembly can be configured to sample the command and address information coupled thereto through a first number of the contacts 65 at a first sampling rate of one time every other clock cycle. In this same example, the component 5 may be configured such that when a second type of the microelectronic assembly 10 having another type of memory therein is attached to the component, the microelectronic elements 30 in the microelectronic assembly can be configured to sample the command and address information coupled thereto through a second number of the contacts 65 at a second sampling rate of two times every third clock cycle (e.g., once each on the rising edge and falling edge of every third clock cycle). Therefore, in this example, the second sampling rate is a non-integer multiple (1.5) of the first sampling rate.

Besides the specific examples described above, the invention contemplates many other integer and non-integer multiple relationships between the second sampling rate and the first sampling rate, in examples where sampling of the command and address information by the microelectronic elements 30 is performed during every clock cycle, and in examples where sampling of the command and address information by the microelectronic elements is only performed during some clock cycles but not other clock cycles.

In one example, the same predetermined arrangement of contacts 65 of the component 5 can be used to connect with first type microelectronic assemblies 10 that include microelectronic elements which operate according to the industry standard DDR3 or DDR4 specification, or to connect with second type microelectronic structures that include microelectronic elements compliant with the industry standard LPDDR3 specification.

In an examples shown herein, in the second type of microelectronic assembly 10, which samples command and address information using fewer contacts 60 than the first type, some of the terminals 25 can be no-connect terminals that may not be needed to transfer address information to the address inputs 35*a* of one or more memory storage arrays in the microelectronic assembly 10.

As used herein, a "no-connect terminal" of a microelectronic assembly means a terminal that is not connected in any electrical path, e.g., path for conducting information to any microelectronic element 30, e.g., semiconductor chip, within the microelectronic assembly 10, whether or not there is ever any information present on such no-connect terminal. Thus, even if information may be present on a no-connect terminal such as may be coupled thereto from the component 5 that is connected to the no-connect terminal, the information present on the no-connect terminal is not in any path to be provided to any microelectronic element 30 within the microelectronic assembly 10.

In any of the embodiments herein, in addition to the first contacts 65, the component 5 can also include a plurality of second contacts 67 coupled to a second set of conductors 71 and configured for connection with corresponding ones of the second terminals 25*b* of the microelectronic assembly 10. The second contacts 67 can be configured for connection with corresponding second terminals 25*b* of the microelectronic assembly 10, the second contacts being configured to carry information other than the command and address information, such as data signals. The second set of conductors 71 can have at least one second bus that is electrically connected with at least some of the second contacts 67. Such a second bus can have a plurality of signal lines configured to carry information other than the address and command information.

The component 5 can also include a device 80 coupled to the set of conductors, the device operable to drive the command and address information to the contacts. In one example, the device 80 can be a driving element electrically connected to the set of conductors 70. The device 80 can be, for example, a microprocessor or a direct memory access controller ("DMA controller"). In a particular embodiment, the device 80 can be a buffering element, or a protocol converter that is configured to convert address information having a first protocol that can be used by the component 5 to a second protocol that can be used by the particular type of microelectronic element 30 in the microelectronic assembly 10. The device 80 can be configured to operate in each of first and second modes for connection of the component 5 with the first type microelectronic assembly 10 via the first arrangement of address and command information assignments, and with the second type microelectronic assembly via the second arrangement of address and command information assignments, respectively.

In a particular example, the device 80 can be at least one central processing unit ("CPU"), the CPU configured to control operations of a plurality of components in the system including read operations from the microelectronic assembly 10 and write operations to the microelectronic assembly. The component 5 may include more than one device 80, including both a direct memory access controller and a CPU, for example. In one embodiment, the component 5 can further include a power supply configured to supply power for use by the component and the microelectronic assembly 10.

Although FIG. 1 shows only a single microelectronic assembly 10 electrically connected with the component 5, in other embodiments, a plurality of microelectronic assemblies can be electrically connected with the component.

Figure 2A:
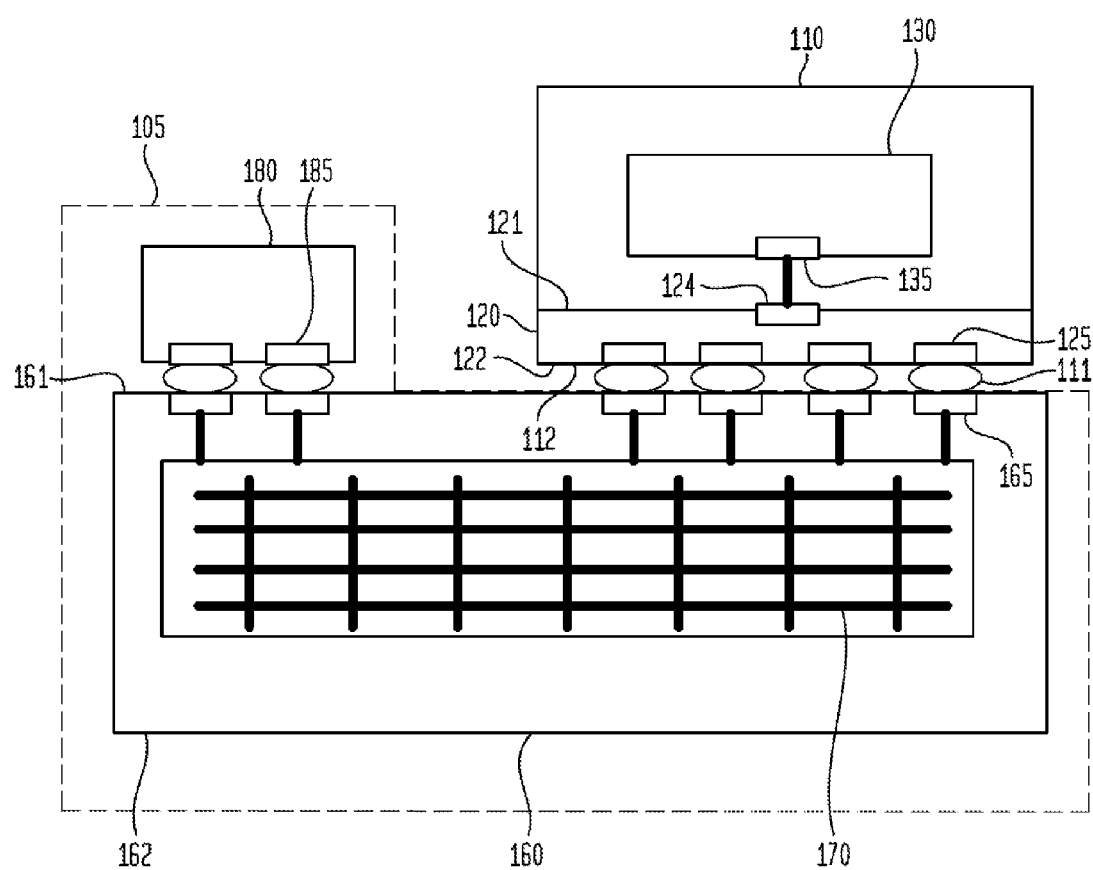
FIG. 2A is a side sectional view illustrating a component having a microelectronic package and a circuit panel according to an embodiment of the invention.

FIG. 2A illustrates a component 105 according to a particular example of the invention shown in FIG. 1. As seen in FIG. 2A, the component 105 includes a circuit panel 160, and the contacts 165 are exposed at a first surface 161 of the circuit panel. The circuit panel 160 (and the circuit panel in other embodiments described herein) can be of various types, such as a printed circuit board used in a dual-inline memory module ("DIMM") module, a circuit board or panel to be connected with other components in a system, or a motherboard, among others.

The microelectronic assembly joined to the circuit panel 160 is in the form of a microelectronic package 110. The microelectronic package 110 has one or more microelectronic elements 130 therein having a surface facing a first surface 121 of a package substrate 120. The microelectronic element 130 has address inputs 135 electrically connected to terminals 125 exposed at a second surface 122 of the substrate 120 opposite the first surface 121. The second surface 122 is an exposed surface of the microelectronic package 110. The terminals 125 can be surface mount terminals (e.g., of type BGA, LGA, PGA, etc.).

Although FIG. 2A shows only a single microelectronic package 110 electrically connected with the component 105, in other embodiments, a plurality of microelectronic packages can be electrically connected with the component. In such embodiments, all of the microelectronic packages 110 can be attached to the first surface 161 of the circuit panel 160, all of the microelectronic packages can be attached to the second surface 162 of the circuit panel, or one or more microelectronic packages can be attached to the first surface of the circuit panel and one or more microelectronic packages can be attached to the second surface.

The microelectronic package 110 may have a plurality of address inputs 135 for receipt of address information specifying locations within the memory storage array. Thus, the address inputs 135 may be contacts exposed at a surface of a microelectronic element 130 as described above. The microelectronic package 110 is configured so as to transfer address information received at particular terminals 125 of the microelectronic structure to the address inputs 135. For example, the microelectronic package 110 may couple signals received on particular terminals 125 of the structure to corresponding particular address inputs 135.

In a particular example, the address inputs 135 can be exposed at a face of a microelectronic element 130, e.g., a semiconductor chip, wherein the face faces towards the first surface 121 of the substrate 120. In another example, the address inputs 135 can be exposed at a face of a microelectronic element 130 that faces away from the first surface 121. In some cases, when the address inputs 135 are exposed at a face of the microelectronic element 130 that faces away from the first surface 121, a die attach adhesive may be disposed between a rear face of the microelectronic element and the first surface 121 of the substrate 120, which may mechanically reinforce the connection between the microelectronic element and the substrate.

As further seen in the particular example in FIG. 2A, a microelectronic element 130 incorporated in the microelectronic assembly 110 may have element contacts 135 at a face thereof that are electrically connected to respective substrate contacts 124 at the first surface 121 or the second surface 122 of the substrate 120. In one example, the microelectronic element 130 can be flip-chip bonded to the substrate 120 via conductive joining elements extending between element contacts 135 of the microelectronic element and corresponding substrate contacts 124 at the first surface 121 of the substrate 120.

In another example, wire bonds may extend through openings in the substrate 120 and may electrically connect the element contacts 135 with substrate contacts at the second surface 122 of the substrate. Alternatively, other types of conductors, e.g., portions of a lead frame, flexible ribbon bonds, etc., may be used to electrically connect the element contacts 135 with the respective substrate contacts 124, which in some cases may connect the element contacts with other conductive elements disposed at a greater height from the front surface 121 than the front face of the microelectronic element 130.

In some embodiments, the contacts 135 may in some cases be connected with active devices of the semiconductor chip 130 through back end of line ("BEOL") wiring of the semiconductor which may include vias or other electrically conductive structure and which may in some cases be disposed underneath the contacts 135.

The terminals 125 (and any of the other terminals described herein) can be electrically conductive elements, e.g., contacts, pads, posts, pins, sockets, wiring, or other electrically conductive structure that are exposed at a first surface 112 of the microelectronic package 110, which in the example shown in FIG. 2A, is the same surface as the second surface 122 of the substrate 120.

In some cases, the terminals 125 can be configured to be conductively bonded to corresponding contacts 165 of another element such as the circuit panel 160, such as with a conductive joining element 111. The conductive joining elements 111 may include a bond metal of a fusible conductive material such as solder, tin, indium, gold, a eutectic material, an electrically conductive matrix material containing metal and polymeric material, among others, or other conductive bond material, and may in some cases also include additional structure such as a conductive bump attached to conductive structure of the substrate 120 such as conductive pads or posts. In other cases, the terminals 125 can be configured to mechanically and electrically engage corresponding features of the circuit panel 160, such as by a pressure or interference fit between corresponding conductive elements of each component, which in some cases, may slide or wipe relative to corresponding conductive surfaces they engage. The terminals 125 can be electrically connected with the substrate contacts 124 through electrically conductive structure on the substrate 120, such as traces and vias, for example.

As shown in FIG. 2A, electrically conductive joining units 111 (e.g., solder balls) can extend between all of the terminals 125 of the microelectronic assembly and corresponding circuit panel contacts 165. However, in an embodiment in which some of the terminals 125 of the microelectric assembly 110 are no-connect terminals (e.g., when the microelectronic element is of the second type, such as LPDDR3), such no-connect terminals may be connected to corresponding circuit panel contacts 65 while not being connected within the microelectronic assembly 110 in any electrical path for conductive information to a microelectronic element 130 within the microelectronic assembly.

In some embodiments, the substrate 120 (or any of the other package substrates described herein) and/or the circuit panel 160 (or any of the other circuit panels described herein) shown in FIG. 2A can include a sheet-like or board-like dielectric element, which may consist essentially of polymeric material, e.g., a resin or polyimide, among others. Alternatively, the substrate 120 and/or the circuit panel 160 can include a dielectric element having a composite construction such as glass-reinforced epoxy, e.g., of BT resin or FR-4 construction. In some examples, the dielectric element of the substrate 120 and/or the circuit panel 160 can have a coefficient of thermal expansion in the plane of the dielectric element, i.e., in a direction parallel to a first surface 110 thereof, of up to 30 parts per million per degree Celsius (hereinafter, "ppm/° C.").

In another example, the substrate 120 can include a supporting element of material having a coefficient of thermal expansion ("CTE") of less than 12 parts per million per degree Celsius, on which the terminals 125 and other conductive structure can be disposed. For example, such low-CTE element can consist essentially of glass, ceramic, or semiconductor material or liquid crystal polymer material, or a combination of such materials.

In one example, the set of conductors 170 can include at least one bus that can extend in a first direction X parallel to the first surface 161 of the circuit panel 160. In a particular example, the at least one bus of the set of conductors 170 can extend in a second direction Y parallel to the first surface 160 of the circuit panel 160, the second direction being transverse to the first direction X. In some embodiments, the signal lines of the busses of the set of conductors 170 can be located in the same plane as one another, and each individual signal line can include conductor portions extending in a plurality of planes and in a plurality of directions.

The at least one bus of the set of conductors 170 can have a plurality of signal lines configured to carry all of the address information transferred to the contacts 165 of the circuit panel 160. The contacts 165 can be electrically connected with the at least one bus of the set of conductors 170. In one example, the at least one bus of the set of conductors 170 can be configured to carry all of the command signals transferred to the contacts 165, the command signals including write enable, row address strobe, and column address strobe signals.

The circuit panel 160 can optionally include one or more termination resistors, which can be connected to a terminal voltage source. One or more of the plurality of signal lines of one or more of the busses of the set of conductors 170 can optionally be electrically connected to a termination resistor.

The contacts 165 shown in FIG. 2A can be arranged according to a predetermined arrangement that defines relative positions on the first surface 161 of the circuit panel 160 (or the second surface 162 if the contacts 165 are exposed at the second surface) of contacts carrying address and command information and data.

The circuit panel 160 can be usable without requiring alteration thereof in first and second modes, each mode being when a given set of the contacts 165 is connected with terminals of a corresponding type of microelectronic package 110. For example, a component 105 can include a circuit panel 160 and a first type microelectronic package 110 having first terminals 125 joined to first contacts 165 of the circuit panel. In another example, a component 5 can include a circuit panel 160 and a second type microelectronic package 110 having first terminals 125 joined to first contacts 165 of the circuit panel.

For example, in the first mode, the circuit panel 160 can be coupled to a first type of microelectronic package 110 that is operable to sample the address and command information carried by the first contacts 165 once per clock cycle. Such microelectronic packages may be of type DDR3 or DDR4 for example, or of type GDDR3, GDDR4 or GDDR5.

There is a progression of standards relating to double data rate DRAM memory and low power double data rate DRAM, and graphics double data rate DRAM memory that are expected to continue in the future for some time to come. The present and future standards starting with the DDR3 standard, the LPDDR3 standard and the GDDR3 standard are referred to herein collectively as "DDRx", "LPDDRx" and "GDDRx," respectively.

In a particular example, in the second mode, the circuit panel 160 can be coupled to a second type of microelectronic package 110 that is operable to sample the address and command information carried by the first contacts 165 twice per clock cycle. Such microelectronic packages 110 may be of type LPDDRx, e.g., LPDDR3 or LPDDR4 among existing and planned standards.

In one embodiment, circuit panel 160 can be coupled to a first type of microelectronic package 110 using a first subset of the first contacts 165, and the same circuit panel can be coupled to a second type of microelectronic package using a second subset of the first contacts, the second subset having a fewer number of contacts than the first subset. In such an embodiment, the first type of microelectronic package 110 can be is operable to sample the address and command information carried by the first subset of the first contacts 165 the same number of times per clock cycle (e.g., once per clock cycle) as the second type of microelectronic package 110 can be operable to sample the address and command information carried by the second subset of the first contacts.

In this embodiment, the first type of microelectronic package 110 can have microelectronic elements of type DDR4, and the second type of microelectronic package can have microelectronic elements of type DDR3. The first subset of the first contacts 165 can include some contacts configured to carry command and address information that is not carried by the second subset of the first contacts, such as, for example, ALERT_N (an I/O signal that can be an output used to signal a parity error), BG (bank group signals), a parity bit input to the chip PAR, sampled just like any other command-address signal, ACT input, and DRAM, which checks the parity based on the information received by the chip, which includes the address information, the PAR bit, and the command info received (i.e., RAS, CAS, ACT (activate an active low signal)). Furthermore, although there are fewer contacts in the second subset of first contacts 165 than in the first subset, the second subset of first contacts can include three bank address signals (for use with DDR3 microelectronic elements), while the first subset of the first contacts can include two bank address signals (for use with DDR4 microelectronic elements).

In a particular embodiment, the one or more microelectronic elements 130 in the first type microelectronic package can incorporate a different type of memory storage array than the one or more microelectronic elements in the second type microelectronic package. In another example, the circuit panel 160 can be coupled to another type of microelectronic package 110 that is operable to sample the address and command information carried by the first contacts 165 four times per clock cycle.

In the embodiment of FIG. 2A, in one example, such as when a first type microelectronic package 110 includes a plurality of microelectronic elements 130, all of the microelectronic elements of the first type microelectronic package can be configured to connect with the same set of conductors 170 that is configured to carry a single set of command-address signals. In such an embodiment, the component 105 may be configured such that when a first type of the microelectronic package 100 having DDR3 or DDR4 memory therein is attached to the component, the microelectronic elements 130 in the microelectronic package can be configured to sample the command and address information coupled thereto through a first number of the contacts 165 at a first sampling rate, such as once per clock cycle (e.g., on the rising edge of the clock cycle).

In the embodiment of FIG. 2A, in another example, such as when a second type microelectronic package 110 includes a plurality of microelectronic elements 130, a first group of first contacts 165 can be connected to a first command-address signal bus of the set of conductors 170, which can be connected to a first half of the microelectronic elements, and a second group of contacts 165 can be connected to a second command-address signal bus of the set of conductors, which can be connected to a second half of the microelectronic elements. The component 105 may be configured such that when a second type of the microelectronic package 110 having LPDDR3 memory therein is attached to the component, the microelectronic elements 30 in the microelectronic package can be configured to sample the command and address information coupled thereto through a second number of the contacts 165 at a second sampling rate, such as twice per clock cycle (e.g., once each on the rising edge and falling edge of the clock cycle).

For example, a second type microelectronic package 110 can include a plurality of microelectronic elements 130, a first half of the microelectronic elements being configured to connect with the first contacts 165 in a first group of first contacts but not with a second group of first contacts, and a second half of the microelectronic elements being configured to connect with the first contacts in the second group of first contacts but not with the first group of first contacts. In such an embodiment, the set of conductors 170 can be configured to carry two identical sets of command-address signals, such that each half of the microelectronic elements 130 can be connected to one of the two sets of command-address signals of the set of conductors. An advantage of the invention is that the physical arrangement of the conductors 170 can be unchanged irrespective of the type of microelectronic package 110 that is electrically connected thereto.

It is not required that all of the set of conductors 170 be used to carry signals. For example, in one embodiment where the set of conductors 170 is configured to carry two identical sets of command-address signals, when the conductors are electrically connected to a microelectronic package 110, it is not necessary that all of the conductors carry signals to the microelectronic package. Even when the set of conductors 170 is configured to carry two identical sets of command-address signals, it is possible for the microelectronic assembly to not use some or all of the conductors configured to carry the duplicate set of command-address signals, in order to reduce the number of switching signals being carried by the set of conductors 170 to reduce power dissipation.

In a particular example, a second type microelectronic package 110 can include a single microelectronic element that is connected with the first contacts 165 in a first group of first contacts but not with a second group of first contacts, such that the single microelectronic element is connected with a first command-address signal bus of the set of conductors 170 but not with a second command-address signal bus of the set of conductors.

The component 105 can also include a device 180 coupled to the set of conductors 170, the device operable to drive the command and address information to the contacts 165. The device 180 can be configured to operate in each of first and second modes for connection of the component 105 with the first type microelectronic assembly 110 via the first arrangement of address and command information assignments, and with the second type microelectronic assembly via the second arrangement of address and command information assignments, respectively, without alteration of the physical configuration of the conductors 170.

Figure 2B:
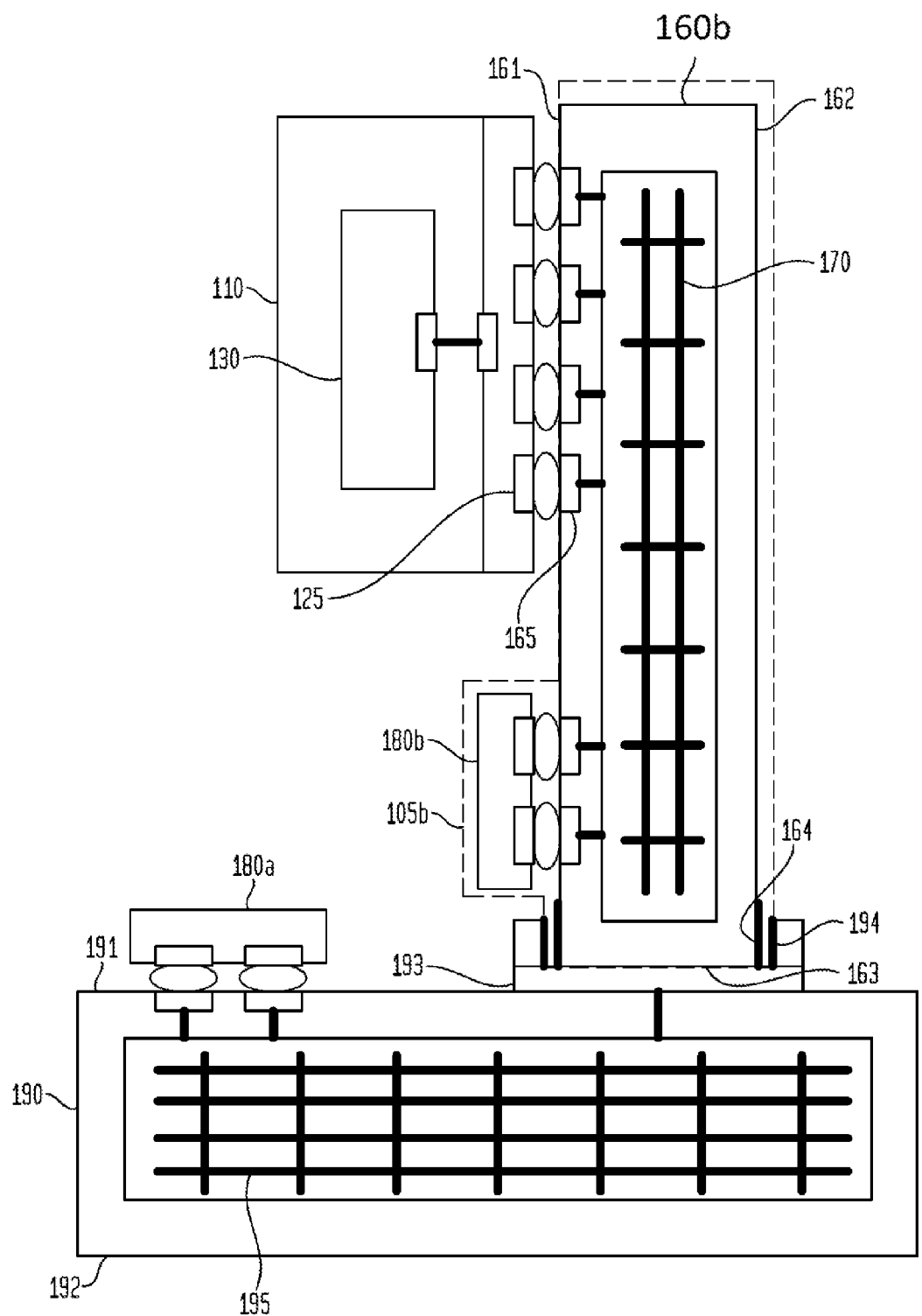
FIG. 2B is a side sectional view illustrating a component having a microelectronic package and a module card according to an embodiment of the invention.

FIG. 2B illustrates a component 105b according to a variation of the invention shown in FIG. 2A. As seen in FIG. 2B, the component 105b includes a circuit panel 160b having at least one row of exposed contacts 164 adjacent an edge 163 of the circuit panel. The exposed contacts 164 can be configured in one or more parallel rows, for example, and the exposed contacts can be configured in any of the ways described below with reference to FIGS. 3A-3C. The component 105b can be coupled to a second circuit panel 190 by inserting the edge 163 into a corresponding socket 193 of the second circuit panel. The component 105b can be coupled to the circuit panel 190 in any of the ways described below with reference to FIGS. 3A-3C.

The second circuit panel 190 can include a device 180a coupled to a set of conductors 195 of the second circuit panel, the device operable to drive the command and address information to the contacts 165 of the circuit panel 160b. The component 105b can include a device 180b coupled to the set of conductors. In one example, the device 180b can be a buffering element, or a protocol converter that is configured to convert address information having a first protocol that can be used by the component 5 or the circuit panel 190 to a second protocol that can be used by the particular type of microelectronic element 130 in the microelectronic assembly 110.

One or both of the devices 180a and 180b can be configured to operate in each of first and second modes for connection of the component 105 with the first type microelectronic assembly 110 via the first arrangement of address and command information assignments, and with the second type microelectronic assembly via the second arrangement of address and command information assignments, respectively.

The circuit panel shown in any of the embodiments of described herein (e.g., the circuit panel 160c of FIGS. 2C and 2D) can be a first circuit panel such as the circuit panel 160b having a connector interface for electrical connection with a second circuit panel such as the circuit panel 190, the connector interface being configured to carrying information for transfer to and from the contacts 165. A particular example of such an arrangement is shown in FIG. 7, where a plurality of components 606, each of which can include a circuit panel 160b, are shown coupled to a second circuit panel 602 via a respective connector interface.

Figure 7:
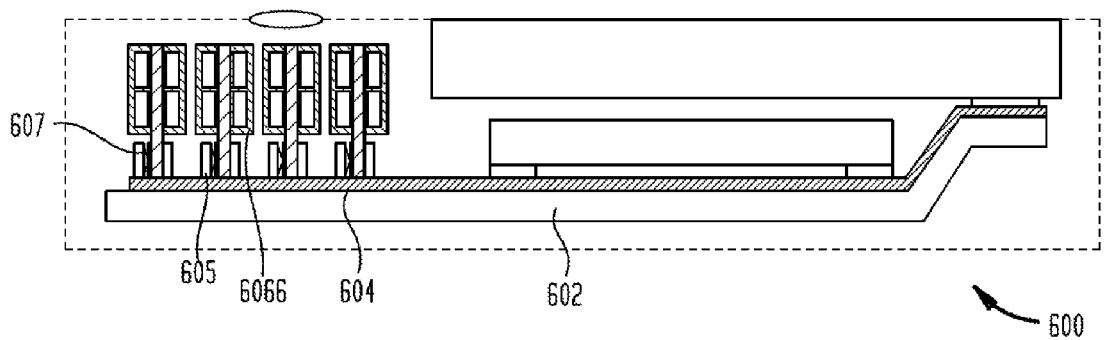
FIG. 7 is a schematic sectional view illustrating a system according to an embodiment of the invention.

In the example shown in FIG. 7, the connector interface can include a socket 605 having a plurality of contacts 607 at one or both sides of the socket, the socket being configured to receive a circuit panel such as the circuit panel 160b having corresponding exposed edge contacts disposed at at least one edge 163 of the circuit panel. In other embodiments, the connector interface between the circuit panel 160c and the second circuit panel 190 can be of the types shown in FIGS. 3A and 3B, or, surface mount connections (e.g., BGA, LGA, etc.).

Figure 2C:
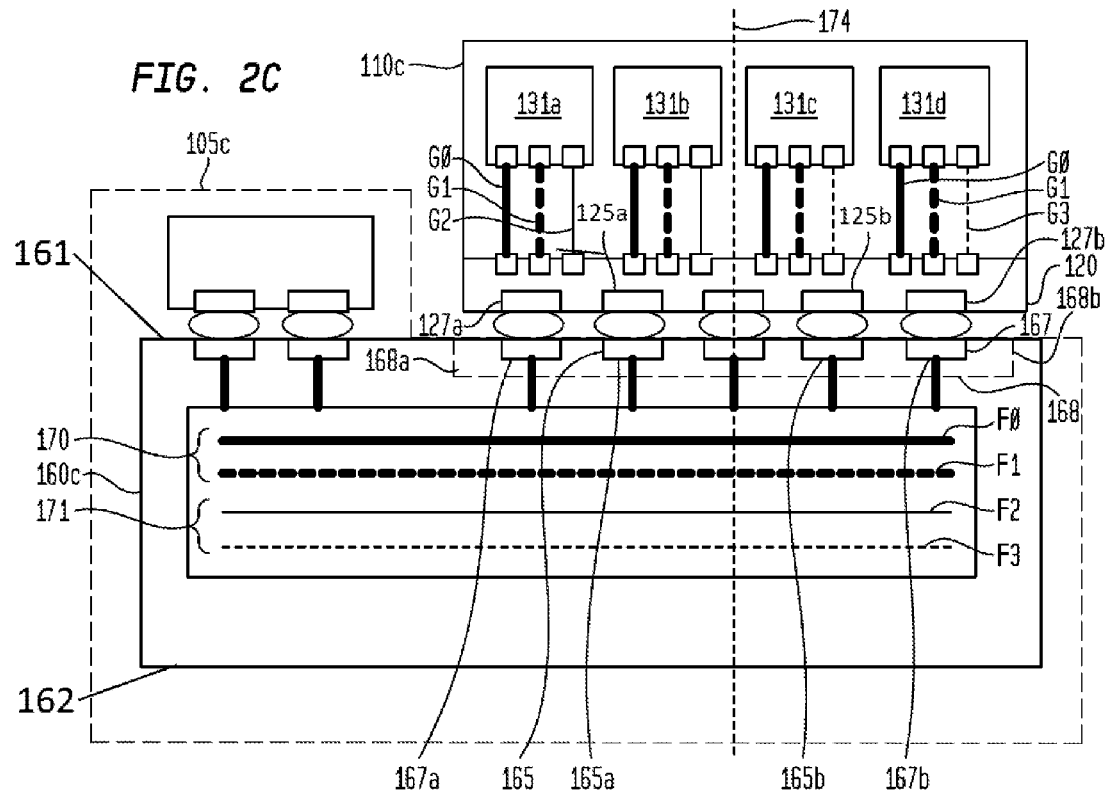
FIG. 2C is a side sectional view illustrating a component having a first type microelectronic package and a circuit panel according to an embodiment of the invention.
Figure 2D:
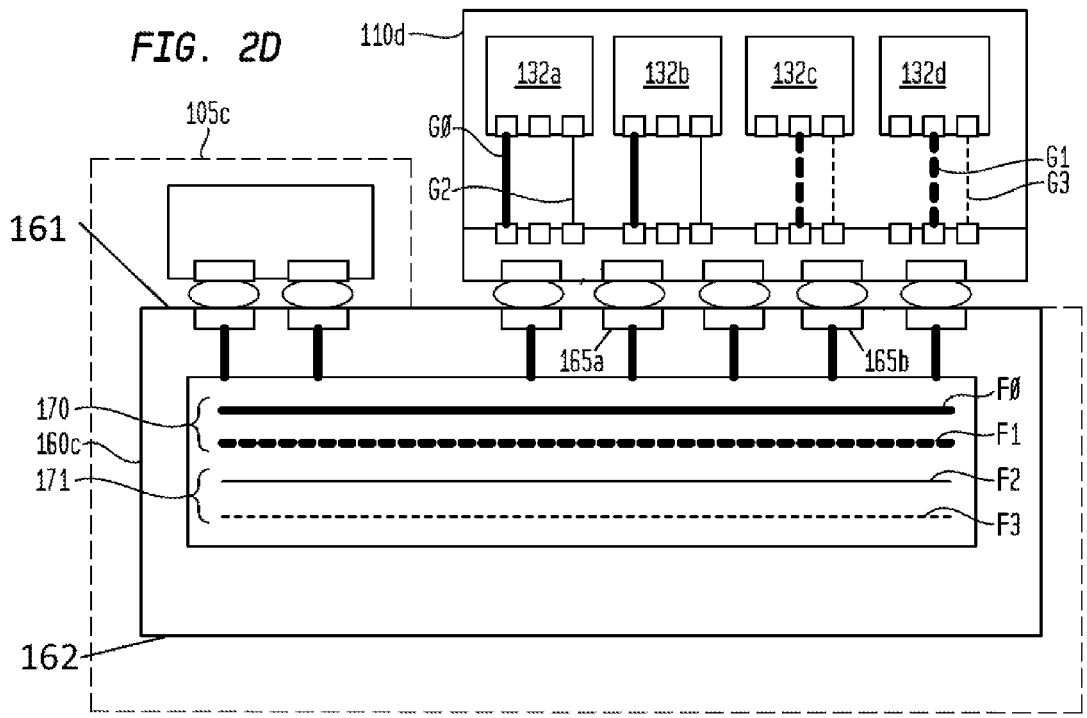
FIG. 2D is a side sectional view illustrating a component having a second type microelectronic package and a circuit panel according to an embodiment of the invention.

FIG. 2C illustrates a component 105c including a circuit panel 160c that is configured for coupling to one or more microelectronic packages 110c. The circuit panel 160c shown in FIGS. 2C and 2D is the same circuit panel, and each of the FIGS. 2C and 2D shows a component 105c including the circuit panel 160c coupled to a different respective microelectronic assembly 110c or 110d.

As can be seen in FIG. 2C, the circuit panel 160c can define first and second surfaces 161, 162. The circuit panel 160c can have at least one set of contacts 168 exposed at the first surface 161 for connection with corresponding surface mount terminals 125 and 127 (e.g., of type BGA, LGA, etc.) of a microelectronic package 110c that incorporates one or more microelectronic elements 131 having a memory storage array.

The circuit panel 160c can have a plurality of sets of contacts 165 and 167, each set 168 of the contacts 165, 167 being configured for connection to a single microelectronic package 110c. The contacts in each set 168 can include first contacts 165 for carrying address and command information and second contacts 167 for carrying information other than the command and address information (e.g., data input/output information).

Similar to FIG. 2A, each set 168 of the contacts can have a predetermined arrangement that defines relative positions on the first surface 161 (or the second surface 162 if the set of contacts is exposed at the second surface) of contacts carrying address and command information and data. The contacts in each set 168 can be arranged according to the predetermined arrangement. The set 168 of the contacts that can be arranged according to two different predetermined arrangements for connection with two different types of the microelectronic assembly 110, respectively, are also referred to herein as a set of "co-support contacts."

The circuit panel 160c can be usable without requiring alteration thereof in first and second modes, each mode being when a given set 168 of contacts is connected with terminals of a corresponding type of microelectronic package 110c or 110d. For example, a component 105c can be joined with a first type microelectronic package 110c (FIG. 2C) having first terminals 125 joined to first contacts 165 of the circuit panel. In another example, the same component 105c a second type microelectronic package 110d (FIG. 2D) having first terminals 125 joined to first contacts 165 of the circuit panel.

For example, in the first mode, the circuit panel 160c can be coupled to a first type of microelectronic package 110c that is operable to sample the address and command information carried by the first contacts 165 once per clock cycle. Examples of such a first type of microelectronic package include the microelectronic package 110c having four microelectronic elements 131a, 131b, 131c, and 131d, as shown in FIG. 2C, or other numbers of microelectronic elements as will be described below. Such a microelectronic package 110c can include microelectronic elements 131 of type DDR3 or DDR4 (generally referred to as DDRx) or of type GDDR3 or GDDR4 (generally referred to as GDDRx).

In a particular example, in the second mode, the circuit panel 160c can be coupled to a second type of microelectronic package 110d that is operable to sample the address and command information carried by the first contacts 165 twice per clock cycle. Examples of such a second type of microelectronic package include the microelectronic package 110d having four microelectronic elements 132a, 132b, 132c, and 132d, shown in FIG. 2D, or other numbers of microelectronic elements as will be described below. Such a microelectronic package 110d can include microelectronic elements 132 of type LPDDR3 or LPDDR4 (generally referred to as LPDDRx).

In a particular embodiment, the one or more microelectronic elements 110c in the first type microelectronic package (e.g., the microelectronic package 110c shown in FIG. 2C) can incorporate a different type of memory storage array than the one or more microelectronic elements in the second type microelectronic package (e.g., the microelectronic package 110d shown in FIG. 2D).

As can be seen in FIG. 2C, the circuit panel 160c can include first contacts 165 in each set of contacts 168 that can include first and second groups of first contacts 165a and 165b. Each group of first contacts 165a and 165b can be assigned for carrying address information usable to specify a location within the memory storage array of the one or more microelectronic elements 131.

When the circuit panel 160c is connected to a first type microelectronic package such as the microelectronic packages 110c shown in FIG. 2C, both of the first and second groups of first contacts 165a and 165b can be used to together specify a location within the memory storage array of the one or more microelectronic elements 110c.

In such an example, the first group of first contacts 165a can be connected to a first command-address signal bus F0 of the set of conductors 170, which can be connected to each microelectronic element 131, and the second group of contacts 165b can be connected to a second command-address signal bus F1 of the set of conductors, which can also be connected to each microelectronic element 131. In particular embodiments, a first type microelectronic package can include one or two microelectronic elements 131, each microelectronic element being configured to connect with the first contacts 165 in each of the first and second groups of first contacts 165a, 165b. In other embodiments, a first type microelectronic package can include more than two microelectronic elements 131, each microelectronic element being configured to connect with the first contacts 165 in each of the first and second groups of first contacts 165a, 165b.

In the example shown in FIG. 2C, the microelectronic package 110c has four microelectronic elements 131, and each of those microelectronic elements can be connected to both the first and second command-address signal busses F0 and F1 of the set of conductors 170. In the example shown in FIG. 2C, each microelectronic element 131a, 131b, 131c, and 131d can receive 16 bits of command-address signal information: 8 bits from the signal bus F0, and 8 bits from the signal bus F1. These connections between the signal busses F0 and F1 and the microelectronic elements 131 are schematically shown in FIG. 2C as conductors G0 that are connected with the signal bus F0 and conductors G1 that are connected with the signal bus F1.

In a variation of the embodiment shown in FIG. 2C, the first type microelectronic package 110c can have eight microelectronic elements 131, and each of those microelectronic elements can be connected to both the first and second command-address signal busses F0 and F1. In such an example, each microelectronic element 131 can receive 16 bits of command-address signal information: 8 bits from the signal bus F0, and 8 bits from the signal bus F1.

Alternatively, when the circuit panel 160c is connected to a second type microelectronic package such as the microelectronic packages 110d shown in FIG. 2D, both of the first and second groups of first contacts 165a and 165b can be used separately to each specify a location within the memory storage array of the one or more microelectronic elements 132a, 132b, 132c, and 132d.

In such an example, the first group of first contacts 165a can be connected to a first command-address signal bus F0 of the set of conductors 170, which can be connected to a first half of the microelectronic elements 132, and the second group of contacts 165b can be connected to a second command-address signal bus F1 of the set of conductors, which can be connected to a second half of the microelectronic elements 132. For example, a second type microelectronic package can include a plurality of microelectronic elements 132, a first half of the microelectronic elements being configured to connect with the first contacts 165 in the first group of first contacts 165a but not with the second group of first contacts 165b, and a second half of the microelectronic elements being configured to connect with the first contacts in the second group of first contacts 165b but not with the first group of first contacts 165a.

In a particular example, a second type microelectronic package can include a single microelectronic element 132 that is connected with the first contacts 165 in the first group of first contacts 165a but not with the second group of first contacts 165b, such that the single microelectronic element is connected with the first command-address signal bus F0 but not with the second command-address signal bus F1.

In FIG. 2D, the microelectronic package 110d has four microelectronic elements 132a, 132b, 132c, and 132d. Two of those microelectronic elements 132a and 132b can be connected with the first group of first contacts 165a but not with the second group of first contacts 165b, such that the microelectronic elements 132a and 132b are connected with the first command-address signal bus F0 of the set of conductors 170 but not the second command-address signal bus F1. Two of the microelectronic elements 132c and 132d can be connected with the second group of first contacts 165b but not with the first group of first contacts 165a, such that the microelectronic elements 132c and 132d are connected to the second command-address signal bus F1 but not the first command-address signal bus F0.

In this embodiment, each signal bus F0 and F1 is configured to carry two identical sets of command-address signals, such that each of the four microelectronic elements 132 can be connected to one of the two sets of command-address signals of a particular signal bus F0 or F1.

In one example of the embodiment shown in FIG. 2D, two of the microelectronic elements 132a and 132b can receive 32 bits of command-address signal information from the first command-address signal bus F0, and two of the microelectronic elements 132c and 132d can receive 32 bits of command-address signal information from the second command-address signal bus F1. In another example of the embodiment shown in FIG. 2D, two of the microelectronic elements 132a and 132b can receive 16 bits of command-address signal information from the first command-address signal bus F0, and two of the microelectronic elements 132c and 132d can receive 16 bits of command-address signal information from the second command-address signal bus F1. These connections between the signal busses F0 and F1 and the microelectronic elements 132 are schematically shown in FIG. 2D as conductors G0 that are connected with the signal bus F0 and conductors G1 that are connected with the signal bus F1.

In a variation of the embodiment shown in FIG. 2D, the second type microelectronic package 110d can have two microelectronic elements 132. A first one of the microelectronic elements 132 can be connected with the first group of first contacts 165b but not with the second group of first contacts 165b, such that the first microelectronic element is connected with the first command-address signal bus F0 but not with the second command-address signal bus F1. A second one of the microelectronic elements 132 can be connected with the second group of first contacts 165b but not with the first group of first contacts 165a, such that the second microelectronic element is connected with the second command-address signal bus F1 but not with the first command-address signal bus F0. In such an example, each microelectronic element 132 can receive 32 bits of command-address signal information from either the first command-address signal bus F0 or the second command-address signal bus F1.

In the particular embodiment of the circuit panel 160c shown in FIG. 2C, each of the first contacts of the first group 165a can have a signal assignment that is symmetric about a theoretical axis 174 with the signal assignment of a corresponding first contact of the second group 165b. A first type microelectronic package such as the microelectronic package 110c having signal assignments that are symmetric about a theoretical axis 174 or a second type microelectronic package such as the microelectronic package 110d having signal assignments that are symmetric (e.g., address signal and no-connect symmetry) about a theoretical axis can be mounted to the same circuit panel 160c.

Although the embodiments of the circuit panel 160c shown herein have first contacts of the first group 165a that have signal assignments that are symmetric about a theoretical axis 174 (FIG. 2C) with signal assignments of corresponding first contacts of the second group 165b, that need not always be the case. The invention described and claimed herein also contemplates circuit panels 160c that have first contacts of the first group 165a that have signal assignments that are not symmetric about a theoretical axis with signal assignments of corresponding first contacts of the second group 165b.

As can be seen in FIG. 2C, the circuit panel 160c can further include second contacts 167 in each set of contacts 168, and such second contacts in each set of contacts can include first and second groups of second contacts 167a and 167b. The second contacts 167 can be assigned for carrying information other than the address and command information. The circuit panel 160c can have at least one second bus F2, F3 of the set of conductors 171 that is electrically connected with at least some of the second contacts 167. Such a second bus F2, F3 can have a plurality of signal lines configured to carry information other than the address and command information.

In one example, each of the four microelectronic elements 131 can be electrically connected with different signal lines within the set of conductors 171. For example, the microelectronic element 131a can receive 16 bits of data signal information from a first half of conductors of the signal bus F2, the microelectronic element 131b can receive 16 bits of data signal information from a second half of conductors of the signal bus F2, the microelectronic element 131c can receive 16 bits of data signal information from a first half of conductors of the signal bus F3, and the microelectronic element 131d can receive 16 bits of data signal information from a second half of conductors of the signal bus F3. These connections between the signal busses F2 and F3 and the microelectronic elements are schematically shown in FIGS. 2C and 2D as conductors G2 that are connected with the signal bus F2 and conductors G3 that are connected with the signal bus F3.

In one example, as can be seen in FIG. 2D, at least some of the second contacts 167 each of the at least one set of contacts 168 can be disposed in first and second areas 167a, 167b adjacent to at least first and second opposite edges 168a, 168b of a periphery of the predetermined of the respective set of contacts, such that all of the first contacts 165 of the respective set of contacts can be disposed between the first and second areas of the respective set of contacts.

Also, in such an example, at least some of the second contacts 167 each of the at least one set of contacts 168 can be disposed in third and fourth areas adjacent to at least third and fourth opposite edges of the periphery of the predetermined of the respective set of contacts, the third and fourth edges extending in a direction between the first and second edges 168a, 168b, such that all of the first contacts 165 of the respective set of contacts are disposed between the third and fourth areas of the respective set of contacts.

The circuit panel 160c shown in any of the embodiments of FIGS. 2C and 2D can have a first set of contacts 168 at the first surface 161 and a second set of contacts 168 at the second surface 162, each of the first and second contacts 165, 167 in each set of contacts 168 being arranged according to the same predetermined arrangement. The circuit panel 160c shown in any of the embodiments of FIGS. 2C and 2D can have a first set of contacts 168 at the first surface 161 and a second set of contacts 168 at the first surface spaced apart from the first set in a direction parallel to the first surface, each of the first and second contacts 165, 167 in each set of contacts 168 being arranged according to the same predetermined arrangement.

In some embodiments, circuit panels 160c having more than one set of contacts 168 can use the same channel of conductors 170 for carrying command and address information to each of the sets of contacts. In other embodiments, circuit panels 160c having more than one set of contacts 168 can use different channels of conductors 170, each channel of conductors being configured for carrying command and address information to a different one of the sets of contacts.

Figure 3A:
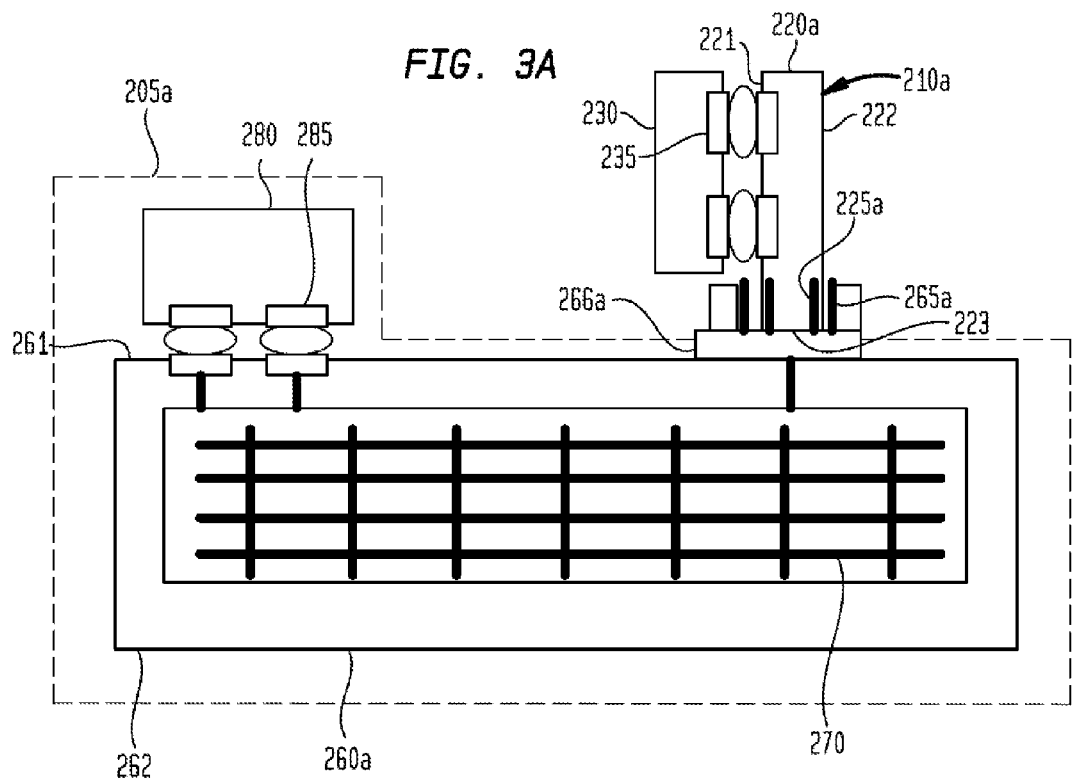
FIG. 3A is a side sectional view illustrating a component having a module and a circuit panel according to an embodiment of the invention.

FIG. 3A illustrates a component 205a according to a particular example of the invention shown in FIG. 1. As seen in FIG. 3A, the component 205a includes a circuit panel 260, and the contacts 265a are disposed in a socket 266a attached to the first surface 261 of the circuit panel and electrically connected with the set of conductors 270.

The microelectronic assembly joined to the circuit panel 260a is a module 210a including a module card 220a and one or more microelectronic elements 230 attached thereto, each microelectronic element having a surface facing a first surface 221 of the module card. The microelectronic element 230 has address inputs 235 electrically connected to terminals 225a of the module card 210a. In a particular embodiment, the module 210a can include a plurality of microelectronic elements 230 that are connected with busses F0, F1, F2, and F3 of the set of conductors 270 in the same manner as shown and described with respect to FIG. 2C or FIG. 2D, depending on whether the microelectronic elements are of the first type or the second type.

As can be seen in FIG. 3A, the terminals 225a are a plurality of parallel exposed edge terminals adjacent an edge 223 of at least one of the first and second surfaces 221, 222 of the module card 220a for mating with the contacts 265a of more sockets 266a when the module is inserted in the socket. Although terminals 225a are shown in FIG. 3A exposed at both the first and second surfaces 221, 222 of the module card 220a, terminals 225a may be exposed at only the first surface, only the second surface, or both the first and second surfaces of the module card.

As can be seen in FIG. 3C, the module card 220a may have one row of parallel exposed edge terminals 225a adjacent the edge 223, a first row of parallel exposed edge terminals 226a and a second row of parallel exposed terminals 226b adjacent the first row of terminals, or a first row of parallel exposed edge terminals 227a and a plurality of rows of parallel exposed terminals 227b, 227c (two additional rows 227 are shown in FIG. 3C, but the module card may include more than two additional rows), the second row of terminals 227b being adjacent the first row of terminals 227a, and the third row of terminals 227c being adjacent the second row of terminals 227b. The module card 220a may have notches 228 extending from the edge 223, such notches facilitating registration of the module card with a multi-part socket 266a that is configured to receive the module card. Although the terminals 225, 226, and 227 shown in FIG. 3C are shown exposed at the first surface 221 of the module card 220a, terminals 225, 226, and 227 may be exposed at only the first surface, only the second surface 222, or both the first and second surfaces of the module card.

Figure 3B:
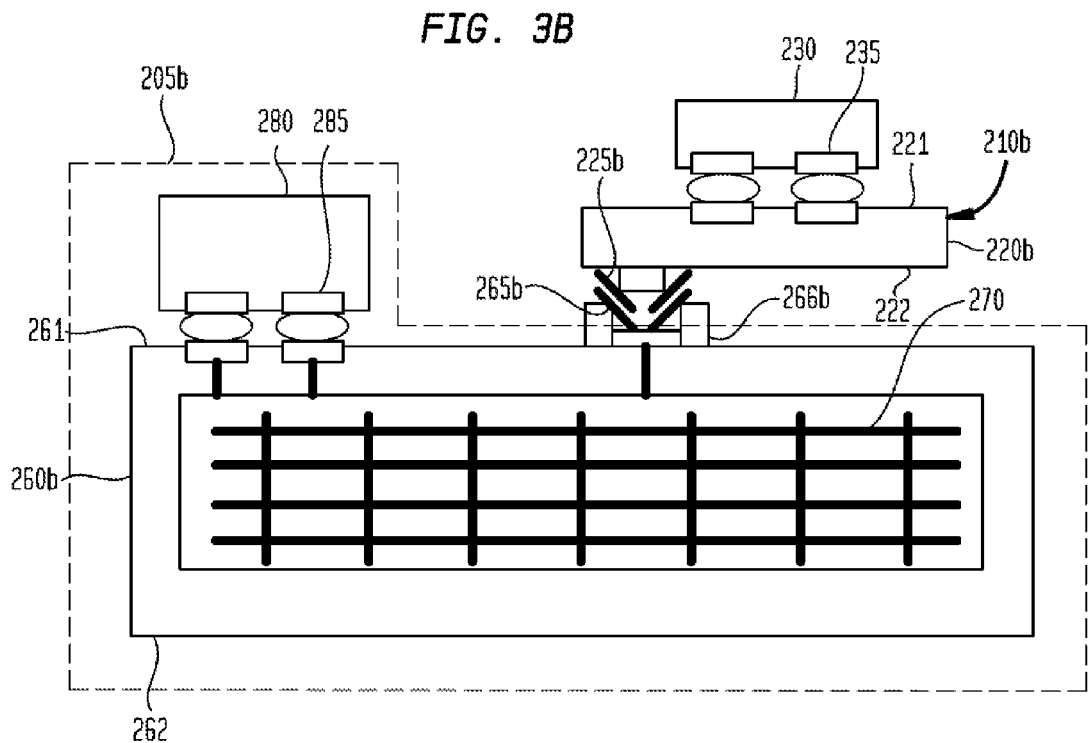
FIG. 3B is a side sectional view illustrating a component having a module and a circuit panel according to a variation of the embodiment of the invention seen in FIG. 3A.

FIG. 3B illustrates a component 205b according to a variation of the invention shown in FIG. 3A. As seen in FIG. 3B, the component 205b includes a circuit panel 260, and the contacts 265b are disposed in a connector 266b attached to the first surface 261 of the circuit panel and electrically connected with the set of conductors 270. The terminals 225b of the module 210b are a plurality of parallel terminals exposed at one of the first and second surfaces 221, 222 of the module card 220b for mating with the contacts 265b of the connector 266b when the module is attached to the connector. In a particular embodiment, the module 210b can include a plurality of microelectronic elements 230 that are connected with busses F0, F1, F2, and F3 of the set of conductors 270 in the same manner as shown and described with respect to FIG. 2C or FIG. 2D, depending on whether the microelectronic elements are of the first type or the second type.

Similar to the embodiment of FIG. 3A described above, the module card 220b may have two rows of parallel exposed terminals 225b exposed at a surface of the module card, four parallel rows of exposed terminals (e.g., one additional row of parallel terminals disposed adjacent each row of terminals 225b), or six or more parallel rows of exposed terminals (e.g., two or more additional rows of parallel terminals disposed adjacent each row of terminals 225b). Also similar to the embodiment of FIG. 3A, the module card 220b may have one or more notches configured to facilitate registration of the module card with a multi-part socket 266b that is configured to receive the module card.

In this embodiment, the socket 266b, the contacts 265b, and the terminals 225b of the module 210b are configured such that, when the when the module attached to the socket, the second surface 222 of the module card 220b is oriented substantially parallel to the first surface 261 of the circuit panel 260b.

Although FIGS. 3A and 3B each show only a single module 210a or 210b electrically connected with the component 205a or 205b, in other embodiments, a plurality of modules can be electrically connected with the component. In such embodiments, all of the modules 210a or 210b can be attached to the first surface 261 of the circuit panel 260a or 260b, all of the modules can be attached to the second surface 262 of the circuit panel, or one or more modules can be attached to the first surface of the circuit panel and one or more modules can be attached to the second surface.

Although FIGS. 3A and 3B show a module card 220a or 220b oriented substantially perpendicular (FIG. 3A) or parallel (FIG. 3B) to the first surface 261 of the circuit panel 260a or 260b, in other embodiments, a module card of a module similar to the module 210a or 210b may be inclined at any other angle relative to the first surface of the circuit panel, such as 15°, 30°, 45°, 60°, or 75°, for example.

Although FIGS. 3A and 3B show module cards 220a, 220b electrically connected to a circuit panel 260a, 260b via a socket 266a, 266b, other connection configurations may be used. For example, the invention contemplates module cards electrically connected to a circuit panel using a ribbon connector extending between terminals of the module card and contacts of the circuit panel.

FIG. 4A illustrates a component 305 according to another particular example of the invention shown in FIG. 1. As seen in FIG. 4A, the component 305 includes a circuit panel 360, and the contacts 365 are upper terminals of a second microelectronic assembly 340 exposed at a first surface 347 of the second microelectronic assembly. The second microelectronic assembly 340 is attached to the first surface 361 of the circuit panel and is electrically connected with the set of conductors 370. Lower terminals 345 of the second microelectronic assembly 340 are electrically connected with corresponding contacts 375 exposed at the first surface 361 of the circuit panel 360.

The microelectronic assembly joined to the circuit panel 360 is in the form of a first microelectronic assembly 310. In the example shown in FIG. 4A, the microelectronic assembly 310 is a microelectronic package having one or more microelectronic elements 330 therein having a surface facing a first surface 321 of a package substrate 320. In a particular embodiment, the first microelectronic assembly 310 can include a plurality of microelectronic elements 330 that are connected with busses F0, F1, F2, and F3 of the set of conductors 370 in the same manner as shown and described with respect to FIG. 2C or FIG. 2D, depending on whether the microelectronic elements are of the first type or the second type.

In a particular example, the microelectronic assembly 310 can include a plurality of stacked microelectronic elements 330 electrically interconnected by conductive structure such as through-silicon vias ("TSVs"). The microelectronic element 330 has address inputs 335 electrically connected to terminals 325 exposed at a second surface 322 of the substrate 320 opposite the first surface 321.

The second microelectronic assembly 340 includes a microelectronic element 341 having active devices therein, and the upper terminals 365 of the second microelectronic assembly are electrically connected with the set of conductors 370 of the circuit panel extending through the second microelectronic assembly.

In the embodiment of FIG. 4A, the microelectronic elements 330 of the first microelectronic assembly (or microelectronic package) 310 can have memory storage array function, and the microelectronic element 341 of the second microelectronic assembly (or microelectronic package) 340 can have microprocessor function.

In an exemplary embodiment, the microelectronic element 330 of the first microelectronic assembly 310 can be directly electrically connected to the microelectronic element 341 of the second microelectronic assembly 340 by electrical connections that extend only within the first and second microelectronic assemblies, not within the circuit panel 360. As used herein, a first microelectronic element of a first microelectronic assembly and a second microelectronic element of a second microelectronic assembly are "directly" connected to one another when the electrical connections extending between the first and second microelectronic elements extend only within the first and second microelectronic assemblies, not within a structure external to the first and second microelectronic assemblies (e.g., a circuit panel).

In one example, the electrical connections between the microelectronic element 330 of the first microelectronic assembly 310 and the microelectronic element 341 of the second microelectronic assembly 340 can include interconnection elements extending in a direction normal to the first surface 347 of the second microelectronic assembly at which the upper terminals (the contacts 365) of the second microelectronic assembly are exposed, the interconnection elements being configured for package-on-package stacking.

In one embodiment, the electrical connections between the microelectronic element 330 of the first microelectronic assembly 310 and the microelectronic element 341 of the second microelectronic assembly 340 can include a bond via array extending from the terminals 365 of the second microelectronic assembly to contacts exposed at a surface 343 of a substrate of the second microelectronic assembly.

Figure 4B:
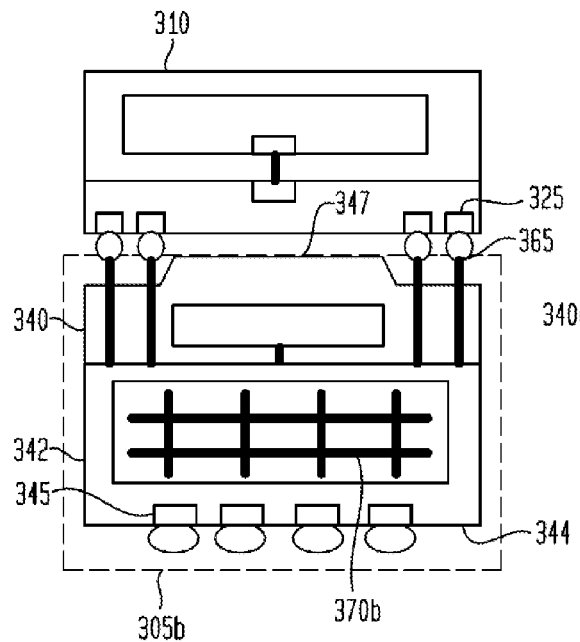
FIG. 4B is a side sectional view illustrating a component having a package-on-package structure according to an embodiment of the invention.

FIG. 4B illustrates a component 305b that is a variation of the component 305 of FIG. 4A, according to another particular example of the invention shown in FIG. 1. As seen in FIG. 4B, the component 305b includes the same second microelectronic assembly 340 shown in FIG. 4A, but it does not include the circuit panel 360. A set of conductors 370 is supported by and/or located within the substrate 342 of the second microelectronic assembly 340. The set of conductors 370 is electrically connected with the contacts 365 at the first surface 347 of the second microelectronic assembly 340. The component 305b can be electrically connected with a circuit panel such as the circuit panel 360 through terminals 345 exposed at a lower surface 344 of the second microelectronic assembly 340.

Figure 4C:
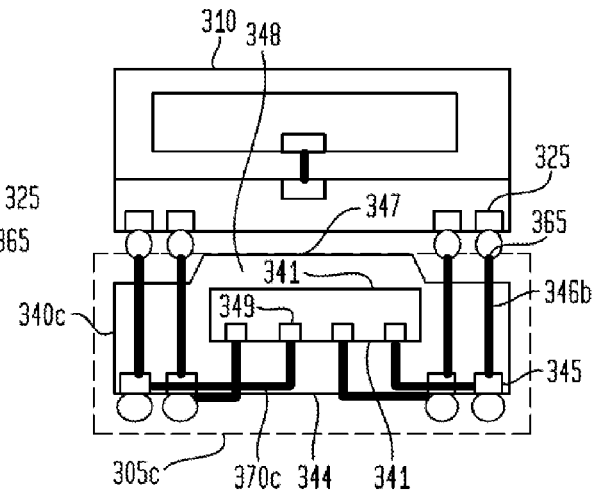
FIG. 4C is a side sectional view illustrating a component having a package-on-package structure according to an embodiment of the invention.

FIG. 4C illustrates a component 305c that is a variation of the component 305b of FIG. 4B, according to another particular example of the invention shown in FIG. 1. As seen in FIG. 4C, the component 305c includes a second microelectronic assembly 340c that is similar to the second microelectronic assembly 340 shown in FIG. 4B, but it does not include the substrate 342. A set of conductors 370c is supported by and/or located within a molded region 348 of the second microelectronic assembly 340c. The set of conductors 370c is electrically connected with the contacts 365 at the first surface 347 of the second microelectronic assembly 340. The set of conductors 370c can electrically connect element contacts 349 of the microelectronic element 341 with the terminals 345 exposed at a lower surface 344 of the second microelectronic assembly 340c.

Figure 5A:
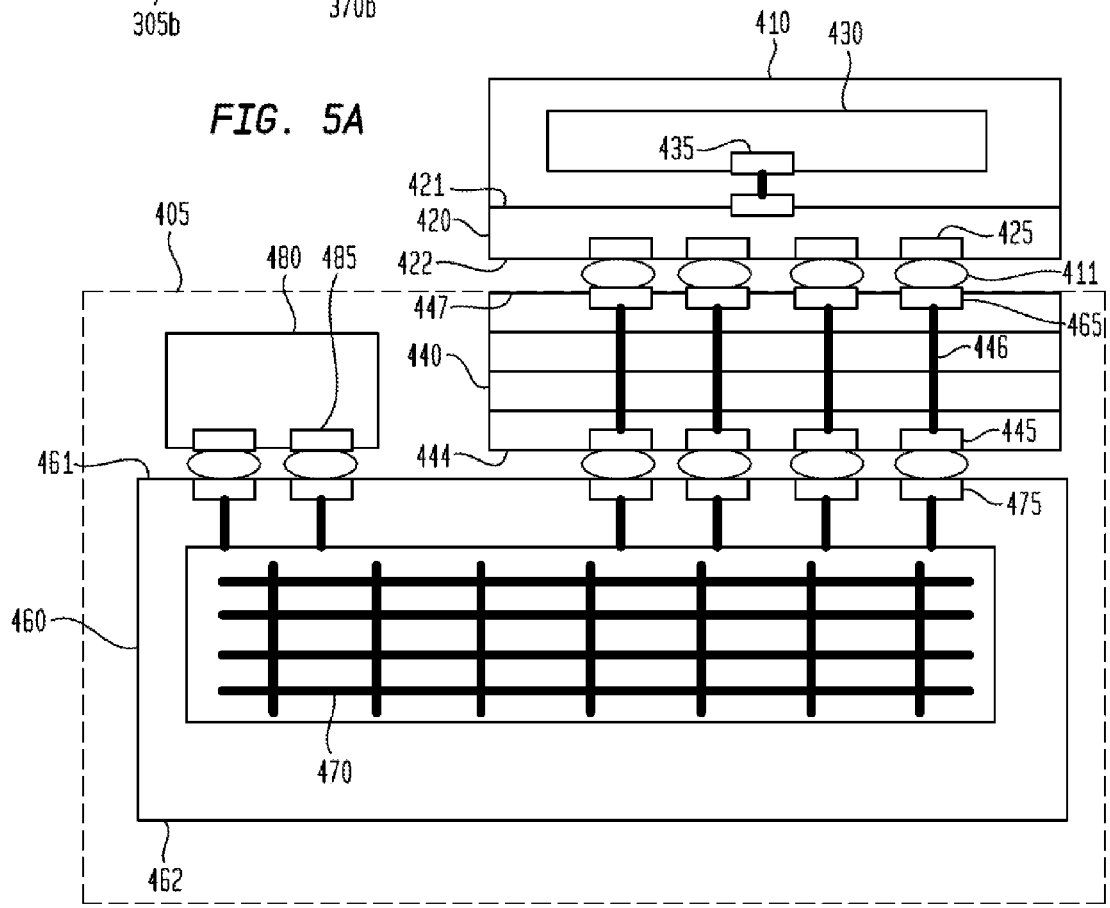
FIG. 5A is a side sectional view illustrating a component having a microelectronic package, a TSV stack, and a circuit panel according to an embodiment of the invention.

FIG. 5A illustrates a component 405 according to yet another particular example of the invention shown in FIG. 1. As seen in FIG. 5A, the component 405 includes a circuit panel 460, and the contacts 465 are upper terminals of a second microelectronic assembly 440 exposed at a first surface 447 of the second microelectronic assembly, or exposed at a dielectric layer (not shown) at a first surface of the second microelectronic assembly. The second microelectronic assembly 440 is attached to the first surface 461 of the circuit panel and is electrically connected with the set of conductors 470. Lower terminals 445 exposed at a second surface 444 of the second microelectronic assembly 440 are electrically connected with corresponding contacts 475 exposed at the first surface 461 of the circuit panel 460.

The microelectronic assembly joined to the circuit panel 460 is in the form of a first microelectronic assembly 410. In the example shown in FIG. 5A, the microelectronic assembly 410 is a microelectronic package having one or more microelectronic elements 430 therein having a surface facing a first surface 421 of a package substrate 420. The microelectronic element 430 has address inputs 435 electrically connected to terminals 425 exposed at a second surface 422 of the substrate 420 opposite the first surface 421. In a particular embodiment, the first microelectronic assembly 410 can include a plurality of microelectronic elements 430 that are connected with busses F0, F1, F2, and F3 of the set of conductors 470 in the same manner as shown and described with respect to FIG. 2C or FIG. 2D, depending on whether the microelectronic elements are of the first type or the second type.

In the embodiment of FIG. 5A, the first microelectronic assembly 410 can include a first microelectronic element 430 and additional microelectronic elements each having active devices therein. In one example, the terminals 425 of the first microelectronic assembly 410 can be electrically connected with the additional microelectronic elements by through-silicon vias extending through the first microelectronic element 430.

The second microelectronic assembly 440 can include one or more microelectronic elements each having active devices therein, and the upper terminals 465 of the second microelectronic assembly can be electrically connected with the set of conductors 470 of the circuit panel by electrical connections extending at least partially within the second microelectronic package. The contacts (or upper terminals) 465 can be exposed at a dielectric layer overlying the first surface 447 of the second microelectronic assembly 440. In an exemplary embodiment, one or more of the microelectronic elements of the second microelectronic assembly 440 can have a logic function.

In a particular example, these electrical connections between the upper terminals 465 of the second microelectronic assembly 440 and the set of conductors 470 can include through-silicon vias 446 extending through the one or more microelectronic elements. These electrical connections can also include by joining units extending between the lower terminals 445 and corresponding contacts 475 exposed at the first surface 461 of the circuit panel 460.

In one example, the second microelectronic assembly 440 can include a first microelectronic element and at least one second microelectronic element, each microelectronic element having active devices therein, the first and second microelectronic elements arranged in a stacked configuration. In a particular embodiment, the upper terminals 465 of the second microelectronic assembly 440 can be electrically connected with the set of conductors 470 of the circuit panel 460 by through-silicon vias 446 extending through the at least one second microelectronic element of the second microelectronic assembly. Although in FIG. 5A, each of the upper terminals 465 are shown as being aligned with (in a horizontal direction) and connected to the through-silicon vias 446, it is not required that the upper terminals be aligned with the through-silicon vias, nor is it required that all of the upper terminals be connected with these through-silicon vias.

Although the first and second microelectronic assemblies 410 and 440 are shown as packaged structures, that need not be the case. In one embodiment, the first microelectronic assembly 410 can be a microelectronic element having a memory storage array function, and the second microelectronic assembly 440 can be a microelectronic element having logic function. Although the first microelectronic assembly 410 is shown as having a flip-chip connection between the terminals 425 and the contacts 465, that need not be the case. In one example, the first microelectronic assembly 410 can be a microelectronic element having a memory storage array function that is oriented with a contact-bearing surface thereof facing away from the upper surface 447 of the second microelectronic assembly 440, and terminals 425 (which can be element contacts) of the first microelectronic assembly 410 can be wire-bonded to the contacts 465 at the upper surface of the second microelectronic assembly.

In a particular example, contacts 465 at the upper surface 447 of the second microelectronic assembly 440 can offer co-support of microelectronic assemblies 410 having DDR3 or DDR4 memory elements therein.

Figure 5B:
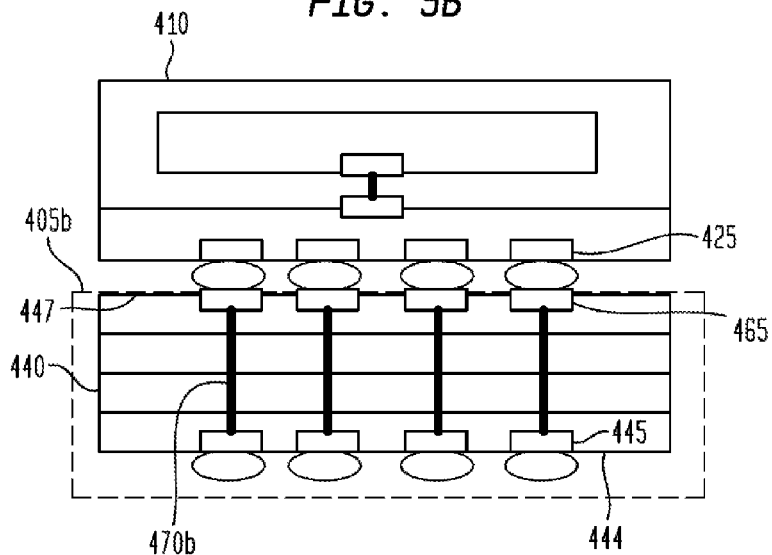
FIG. 5B is a side sectional view illustrating a component having a microelectronic package and a TSV stack according to an embodiment of the invention.

FIG. 5B illustrates a component 405b that is a variation of the component 405 of FIG. 5A, according to another particular example of the invention shown in FIG. 1. As seen in FIG. 5B, the component 405b includes the same second microelectronic assembly 440 shown in FIG. 5A, but it does not include the circuit panel 460.

A set of conductors 470b can be supported by and/or located within the microelectronic elements of the second microelectronic assembly 440. The set of conductors 470b can include TSVs and/or redistribution traces connected to TSVs, for example. The set of conductors 470 can be electrically connected with the contacts 465 at the first surface 447 of the second microelectronic assembly 340. The component 405b can be electrically connected with a circuit panel such as the circuit panel 460 through terminals 445 exposed at a lower surface 444 of the second microelectronic assembly 440. In the embodiment of FIG. 5B, one or more of the microelectronic elements in the microelectronic assembly 440 can be a support structure for the set of conductors 470b, or a dielectric layer overlying one of the microelectronic elements in the microelectronic assembly can be a support structure for the set of conductors.

Each of the examples illustrated and discussed above can be implemented with microelectronic elements therein having contacts on faces thereof which either face in the same direction which the first surface of the microelectronic assembly faces, or can face away from the direction in which the first surface of the microelectronic assembly faces. Thus, in particular examples, the microelectronic assemblies may be as shown and described in the examples of any of FIGS. 13-20 of commonly owned U.S. application Ser. No. 13/439,317, the disclosure of which is incorporated by reference herein.

Although the examples described above refer to the microelectronic elements overlying a substrate, the substrate may be omitted in an appropriate case, as when the microelectronic elements are arranged together within a molded unit, e.g., a wafer-level unit, in which a dielectric layer may be formed on or above contact-bearing faces of the microelectronic elements for supporting traces and electrical interconnections thereon.

In other examples, microelectronic assemblies having multiple stacked microelectronic elements therein may be single or multiple stack implementations as shown and/or described with reference to FIGS. 21-25 of commonly owned U.S. application Ser. No. 13/439,317, the disclosure of which is incorporated by reference herein.

In still other examples, microelectronic assemblies having four microelectronic elements therein may be as shown and described in FIGS. 9A-B, 9C, 9D, 9F, 9G, 9H, 12B, 12C or 12D of commonly owned U.S. application Ser. Nos. 13/337,565 and 13/337,575, or may be as shown and described in FIGS. 7A-B, 8, 11A, 11B, 11C, 11D, 12, 13B, 14B, or 14C of commonly owned U.S. application Ser. No. 13/354,747, the disclosures of which are incorporated by reference herein.

Figure 6:
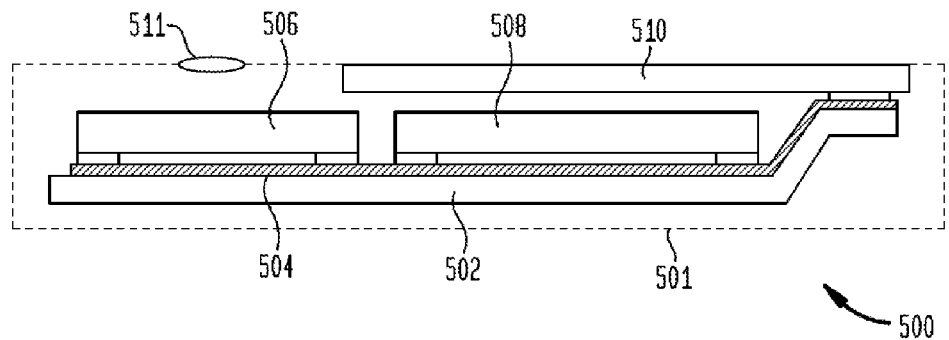
FIG. 6 is a schematic sectional view illustrating a system according to an embodiment of the invention.

The microelectronic packages and microelectronic assemblies described above with reference to FIGS. 1-5 above can be utilized in construction of diverse electronic systems, such as the system 500 shown in FIG. 6. For example, the system 500 in accordance with a further embodiment of the invention includes a plurality of modules or components 506 such as the microelectronic packages and/or microelectronic assemblies as described above in conjunction with other electronic components 508, 510 and 511.

In the exemplary system 500 shown, the system can include a circuit panel, motherboard, or riser panel 502 such as a flexible printed circuit board, and the circuit panel can include numerous conductors 504, of which only one is depicted in FIG. 6, interconnecting the modules or components 506, 508, 510 with one another. Such a circuit panel 502 can transport signals to and from each of the microelectronic packages and/or microelectronic assemblies included in the system 500. However, this is merely exemplary; any suitable structure for making electrical connections between the modules or components 506 can be used.

In a particular embodiment, the system 500 can also include a processor such as the semiconductor chip 508, such that each module or component 506 can be configured to transfer a number N of data bits in parallel in a clock cycle, and the processor can be configured to transfer a number M of data bits in parallel in a clock cycle, M being greater than or equal to N.

In the example depicted in FIG. 6, the component 508 is a semiconductor chip and component 510 is a display screen, but any other components can be used in the system 500. Of course, although only two additional components 508 and 511 are depicted in FIG. 6 for clarity of illustration, the system 500 can include any number of such components.

Modules or components 506 and components 508 and 511 can be mounted in a common housing 501, schematically depicted in broken lines, and can be electrically interconnected with one another as necessary to form the desired circuit. The housing 501 is depicted as a portable housing of the type usable, for example, in a cellular telephone or personal digital assistant, and screen 510 can be exposed at the surface of the housing. In embodiments where a structure 506 includes a light-sensitive element such as an imaging chip, a lens 511 or other optical device also can be provided for routing light to the structure. Again, the simplified system shown in FIG. 6 is merely exemplary; other systems, including systems commonly regarded as fixed structures, such as desktop computers, routers and the like can be made using the structures discussed above.

The microelectronic packages and microelectronic assemblies described above with reference to FIGS. 1-5 can also be utilized in construction of an electronic system such as the system 600 shown in FIG. 7. For example, the system 600 in accordance with a further embodiment of the invention is the same as the system 500 shown in FIG. 6, except the component 506 has been replaced by a plurality of components 606.

Each of the components 606 can be or can include one or more of the microelectronic packages or microelectronic assemblies described above with reference to FIGS. 1-5. In a particular example, one or more of the components 606 can be a variation of the component 5 shown in FIG. 1, in which the support structure 60 includes exposed edge contacts, and the support structure of each component 5 can be suitable for insertion into a socket 605.

Each socket 605 can include a plurality of contacts 607 at one or both sides of the socket, such that each socket 605 can be suitable for mating with corresponding exposed edge contacts of a corresponding component 606 such as the above-described variation of the component 5. In the exemplary system 600 shown, the system can include a second circuit panel 602 or motherboard such as a flexible printed circuit board, and the second circuit panel can include numerous conductors 604, of which only one is depicted in FIG. 7, interconnecting the components 606 with one another.

In a particular example, a module such as the system 600 can include a plurality of components 606, each component 606 being the above-described variation of the component 5. Each component 606 can be mounted to, and electrically connected with the second circuit panel 602 for transport of signals to and from each component 606. The specific example of the system 600 is merely exemplary; any suitable structure for making electrical connections between the components 606 can be used.

Various features of the above-described embodiments of the invention can be combined in ways other than as specifically described above without departing from the scope or spirit of the invention. It is intended for the present disclosure to cover all such combinations and variations of embodiments of the invention described above.

The following paragraphs additionally describe features and embodiments of the invention:

A microelectronic package family, including
a plurality of microelectronic packages each having terminals for connection with corresponding contacts of an external component and each including a microelectronic element having a memory storage array having a given number of storage locations, the terminals of each microelectronic package being configured to receive corresponding command and address information specifying one of the storage locations, each microelectronic element having inputs connected with the terminals of the respective microelectronic package, wherein the microelectronic element of a first microelectronic package of the family is configured to sample first command and address information coupled thereto through the terminals of the first package at a first sampling rate, and the microelectronic element of a second microelectronic package of the family is configured to sample second command and address information coupled thereto through the terminals of the second package at a second sampling rate being greater than the first sampling rate, the terminals of the first package being configured to connect to a set of contacts of the external component arranged according to a first predetermined arrangement for receipt of the first command and address information, and the terminals of the second package being configured to connect to a set of contacts of the external component arranged according to a second predetermined arrangement for receipt of the second command and address information, wherein the set of contacts arranged according to the second predetermined arrangement include at least some contacts occupying identical positions with the set of contacts arranged according to the first predetermined arrangement, the set of contacts arranged according to the second predetermined arrangement being fewer in number than the set of contacts arranged according to the first predetermined arrangement.

Thus, for example, the microelectronic package 10 shown in FIG. 1 can in any of the foregoing embodiments be any of the types of packages described in the foregoing embodiments. The first type of microelectronic package 110c (FIG. 2C), for example, can include a microelectronic element 131 configured to sample first command and address information coupled thereto through the terminals 125 of such package at a first sampling rate. The second type of microelectronic package 110d, for example, can include microelectronic element 132 configured to sample second command and address information coupled thereto through the terminals 125 through the second package at a second sampling rate greater than the first sampling rate.

As can be seen in FIG. 2C, the terminals 125 of the first package 110c can be configured to connect to a set of contacts 165 of the external component 105c arranged according to a first predetermined arrangement for receipt of the first command and address information. As can be seen in FIG. 2D, the terminals 125 of the second package 110d can be configured to connect to a set of contacts 165 of the external component 105d arranged according to a second predetermined arrangement for receipt of the second command and address information.

Referring to FIGS. 2C and 2D, the set 168 of contacts 165 arranged according to the second predetermined arrangement can include at least some contacts occupying identical positions with the set of contacts arranged according to the first predetermined arrangement. The set 168 of contacts 165 arranged according to the second predetermined arrangement can be fewer in number than the set of contacts arranged according to the first predetermined arrangement.

The invention claimed is:

1. A system, comprising:
a microelectronic assembly which includes a set of terminals and a microelectronic element having a memory storage array having a given number of storage locations, the microelectronic element of the assembly having inputs connected with the terminals for receiving command and address information specifying one of the storage locations; and
a component for connection with the microelectronic assembly, the component including:
a support structure bearing a set of conductors configured to carry the command and address information; and
a plurality of contacts coupled to the set of conductors, the contacts electrically connected with corresponding ones of the terminals of the microelectronic assembly,
wherein the contacts have address and command information assignments arranged in
(a) a first predetermined arrangement for connection with a first type of the microelectronic assembly in which the microelectronic element is configured to sample the command and address information coupled thereto through the contacts at a first sampling rate, the contacts having a first number thereof, and in
(b) a second predetermined arrangement for connection with a second type of the microelectronic assembly in which the microelectronic element is configured to sample the command and address information coupled thereto through a subset of the contacts including a second number of the contacts at a second sampling rate being greater than the first sampling rate, the subset including some contacts occupying identical positions with the contacts that are assigned to the first predetermined arrangement, the second number being fewer than the first number.

2. The system of claim 1, wherein all of the contacts of the subset of contacts arranged according to the second predetermined arrangement occupy identical positions with the contacts that are assigned to the first predetermined arrangement.

3. The system of claim 1, wherein the second sampling rate is an integer multiple of the first sampling rate.

4. The system of claim 1, further comprising a device coupled to the set of conductors, the device being operable to drive the command and address information to the contacts.

5. The system of claim 4, wherein the device is configured to operate in each of first and second modes for connection of the component with the first type microelectronic assembly via the first arrangement, and with the second type microelectronic assembly via the second arrangement, respectively.

6. The system of claim 1, further comprising at least one central processing unit ("CPU"), the CPU configured to control operations of a plurality of components in the system including read operations from the microelectronic assembly and write operations to the microelectronic assembly.

7. The system of claim 1, further comprising a power supply configured to supply power for use by the component and the microelectronic assembly.

8. The system of claim 5, wherein the microelectronic assembly is the first type microelectronic assembly.

9. The system of claim 5, wherein the microelectronic assembly is the second type microelectronic assembly.

10. The system of claim 1, wherein the component is a circuit panel, and the contacts are exposed at a surface of the circuit panel.

11. The system of claim 10, wherein the microelectronic assembly is a microelectronic package, and wherein the terminals are surface mount terminals exposed at a surface of the microelectronic package.

12. The system of claim 10, wherein the circuit panel is a motherboard.

13. The system of claim 10, wherein the circuit panel is a module card, the module card including one or more rows of exposed module contacts, at least one of the rows of module contacts disposed adjacent an edge of the first or second surfaces for mating with contacts of a socket of a second circuit panel when the module is inserted in the socket.

14. The system of claim 1, wherein the component is a circuit panel, and the contacts are disposed in a socket electrically connected with the circuit panel.

15. The system of claim 14, wherein the microelectronic assembly includes a module card having first and second opposed surfaces, and wherein the terminals are a plurality of parallel exposed terminals adjacent an edge of at least one of the first and second surfaces for mating with the contacts of the socket when the module is inserted in the socket.

16. The system of claim 1, wherein the component is a circuit panel and the contacts are disposed in a connector electrically connected with the circuit panel, wherein the microelectronic assembly includes a module card having first and second opposed surfaces, and wherein the terminals are a plurality of parallel terminals exposed at one of the first and second surfaces for mating with the contacts of the connector when the module is attached to the connector.

17. The system of claim 1, wherein the microelectronic assembly is a first microelectronic assembly and the component is a second microelectronic assembly, and the contacts are terminals of the second microelectronic assembly.

18. The system of claim 17, wherein the second microelectronic assembly is coupled to the support structure and includes a microelectronic element having active devices therein, and the microelectronic element of the first microelectronic assembly is coupled with the microelectronic element of the second microelectronic assembly by electrical connections that extend only within the first and second microelectronic assemblies.

19. The system of claim 18, wherein the electrical connections between the microelectronic element of the first microelectronic assembly and the microelectronic element of the second microelectronic assembly include interconnection elements extending in a direction normal to a surface of the second microelectronic assembly at which the terminals of the second microelectronic assembly are exposed, the interconnection elements being configured for package-on-package stacking.

20. The system of claim 17, wherein the second microelectronic assembly is coupled to the support structure and includes a microelectronic element having active devices therein, the terminals of the second microelectronic assembly being exposed at a surface of the microelectronic element of the second microelectronic assembly.

21. The system of claim 20, wherein the microelectronic element of the second microelectronic assembly is a first microelectronic element, the second microelectronic assembly further comprising at least one second microelectronic element each having active devices therein, the first and second microelectronic elements arranged in a stacked configuration.

22. The system of claim 21, wherein the terminals of the second microelectronic assembly are electrically connected with the set of conductors of the support structures by through-silicon vias extending through the at least one second microelectronic element.

23. The system of claim 20, wherein the microelectronic element of the second microelectronic assembly includes a logic function.

24. The system of claim 1, wherein the contacts are first contacts and the conductors are a first set of conductors, the component further comprising a plurality of second contacts coupled to a second set of conductors, the second contacts configured for connection with corresponding terminals of the microelectronic assembly, the second contacts being configured to carry information other than the command and address information.

25. The system of claim 1, wherein the microelectronic element in the first type of the microelectronic assembly is of type DDRx, and the microelectronic element in the second type of the microelectronic assembly is of type LPDDRx.

26. A system, comprising:
a microelectronic assembly which includes a set of terminals and a microelectronic element having a memory storage array having a given number of storage locations, the microelectronic element of the assembly having inputs connected with the terminals for receiving command and address information specifying one of the storage locations; and
a component for connection with the microelectronic assembly, the component including:
a support structure bearing a set of conductors configured to carry the command and address information; and
a plurality of contacts coupled to the set of conductors, the contacts electrically connected with corresponding ones of the terminals of the microelectronic assembly,
wherein the contacts have address and command information assignments arranged in
(a) a first predetermined arrangement for connection with a first type of the microelectronic assembly in which the microelectronic element is configured to sample the command and address information coupled thereto through a first subset of the contacts including a first number of the contacts, and in
(b) a second predetermined arrangement for connection with a second type of the microelectronic assembly in which the microelectronic element is configured to sample the command and address information coupled thereto through a second subset of the contacts including a second number of the contacts, the first and second subsets including some contacts occupying identical positions, the second number being fewer than the first number.

27. The system of claim 26, wherein the command and address information of the first type of the microelectronic assembly includes parity information, the microelectronic element in the first type of the microelectronic assembly is configured to sample the parity information, and the second subset of the contacts for connection with the second type of the microelectronic assembly is not configured to sample the parity information.

28. The system of claim 26, wherein the microelectronic element in the second type of the microelectronic assembly is of type DDR3, and the microelectronic element in the first type of the microelectronic assembly is of type DDR4.

29. The system of claim 28, wherein the command and address information of the first type of the microelectronic assembly having the DDR4 type microelectronic element includes parity information, and the DDR4 type microelectronic element in the first type of the microelectronic assembly is configured to sample the parity information.

30. The system of claim 26, wherein the microelectronic element in the second type of the microelectronic assembly is of type DDRx, and the microelectronic element in the first type of the microelectronic assembly is of type DDR(x+1).

* * * * *